US012787765B2

(12) United States Patent
Shih et al.

(10) Patent No.: US 12,787,765 B2
(45) Date of Patent: Nov. 3, 2026

(54) PACKAGE STRUCTURE INCLUDING HEAT SINK STRUCTURE AND METHOD FOR MANUFACTURING THE SAME

(71) Applicant: NANYA TECHNOLOGY CORPORATION, New Taipei City (TW)

(72) Inventors: Shing-Yih Shih, New Taipei City (TW); Tse-Yao Huang, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 357 days.

(21) Appl. No.: 18/670,912

(22) Filed: May 22, 2024

(65) Prior Publication Data

US 2025/0364350 A1 Nov. 27, 2025

(51) Int. Cl.
*H10W 40/22* (2026.01)
*H10W 40/70* (2026.01)
(Continued)

(52) U.S. Cl.
CPC ........... *H10W 40/22* (2026.01); *H10W 40/70* (2026.01); *H10W 74/111* (2026.01); (Continued)

(58) Field of Classification Search
CPC ... H10W 40/22; H10W 40/70; H10W 40/778; H10W 40/228; H10W 74/111; H10W 74/117; H10W 90/00; H10W 90/288; H10W 90/297; H10W 90/792; H10W 90/796
See application file for complete search history.

(56) References Cited

U.S. PATENT DOCUMENTS

2012/0049347 A1* 3/2012 Wang .................... H10W 40/22 257/737
2016/0049349 A1* 2/2016 Lane ..................... H10W 40/22 257/777
(Continued)

FOREIGN PATENT DOCUMENTS

CN 110660759 A 1/2020
TW 202406059 A 2/2024

OTHER PUBLICATIONS

Office Action and and the search report mailed on Jun. 17, 2025 related to Taiwanese Application No. 113132865.
(Continued)

*Primary Examiner* — Mohsen Ahmadi
(74) *Attorney, Agent, or Firm* — Xuan Zhang

(57) ABSTRACT

The present application discloses a package structure and a method for manufacturing the package structure. The package structure includes an electronic device and a heat sink structure. The heat sink structure is disposed over the electronic device, and includes a base portion, a plurality of thermal vias and a thermally conductive layer. The thermal vias extends through the base portion. The thermally conductive layer is disposed between the base portion and the electronic device. The thermal vias are thermally connected to the electronic device through the thermally conductive layer so as to dissipate a heat generated from the electronic device.

18 Claims, 25 Drawing Sheets

(51) Int. Cl.
*H10W 74/10* (2026.01)
*H10W 90/00* (2026.01)
*H10W 90/20* (2026.01)

(52) U.S. Cl.
CPC .......... *H10W 90/00* (2026.01); *H10W 90/288* (2026.01); *H10W 90/297* (2026.01); *H10W 90/792* (2026.01); *H10W 90/796* (2026.01)

(56) References Cited

U.S. PATENT DOCUMENTS

| | | | | |
|---|---|---|---|---|
| 2018/0159203 | A1* | 6/2018 | Baks | H01Q 1/2283 |
| 2019/0245543 | A1* | 8/2019 | Lee | H03K 19/1776 |
| 2020/0243464 | A1* | 7/2020 | Hsu | H01Q 1/02 |
| 2020/0357729 | A1* | 11/2020 | Kim | H10W 90/811 |
| 2021/0043544 | A1* | 2/2021 | Eid | H03H 9/02102 |
| 2023/0282546 | A1* | 9/2023 | Waidhas | H10W 20/056<br>257/678 |
| 2024/0014091 | A1 | 1/2024 | Wang et al. | |
| 2024/0379498 | A1* | 11/2024 | Tong | H10W 40/47 |
| 2024/0421027 | A1* | 12/2024 | Tong | H10B 80/00 |
| 2025/0226277 | A1* | 7/2025 | Vaziri | H10W 20/023 |

OTHER PUBLICATIONS

Summary translation of Office Action and and the search report mailed on Jun. 17, 2025 related to Taiwanese Application No. 113132865.

Office Action and and the search report mailed on Feb. 24, 2026 related to Taiwanese Application No. 114128756.

Summary translation of Office Action and and the search report mailed on Feb. 24, 2026 related to Taiwanese Application No. 114128756.

* cited by examiner

PACKAGE STRUCTURE INCLUDING HEAT SINK STRUCTURE AND METHOD FOR MANUFACTURING THE SAME

TECHNICAL FIELD

The present disclosure relates to a package structure and a method for manufacturing the same, and more particularly, to a package structure including heat sink structure, and a method for manufacturing the same.

DISCUSSION OF THE BACKGROUND

Semiconductor package structures are used in a variety of electronic applications, and the dimensions of package structures are continuously being scaled down to meet the current application requirements. However, a variety of issues arise during the scaling-down process and impact the final electrical characteristics, quality, cost and yield. For example, heat dissipation.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a package structure including an electronic device and a heat sink structure. The heat sink structure is disposed over the electronic device, and includes a base portion, a plurality of thermal vias and a thermally conductive layer. The thermal vias extends through the base portion. The thermally conductive layer is disposed between the base portion and the electronic device. The thermal vias are thermally connected to the electronic device through the thermally conductive layer so as to dissipate a heat generated from the electronic device.

Another aspect of the present disclosure provides a package structure including an electronic device and a heat sink structure. The heat sink structure is disposed over the electronic device, and includes a thermally conductive layer, a plurality of thermal vias and a plurality of pads. The thermal vias connect to a second surface of the thermally conductive layer. The pads connect to a first surface of the thermally conductive layer. The pads are thermally connected to the electronic device so as to dissipate a heat generated from the electronic device to the thermal vias through the thermally conductive layer.

Another aspect of the present disclosure provides a method for manufacturing a package structure including: providing an electronic device; providing a heat sink structure, wherein the heat sink structure includes a base portion, a plurality of thermal vias disposed in the base portion and a thermally conductive layer connecting the plurality of thermal vias; and thermally connecting the heat sink structure to the electronic device, wherein the thermally conductive layer is disposed between the base portion and the electronic device.

Due to the design of the package structure of the present disclosure, the heat generated by the electronic device may be dissipated or transmitted to the thermal vias through a thermal path readily and quickly. Thus, the reliability and working life of the package structure may be improved.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRA WINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
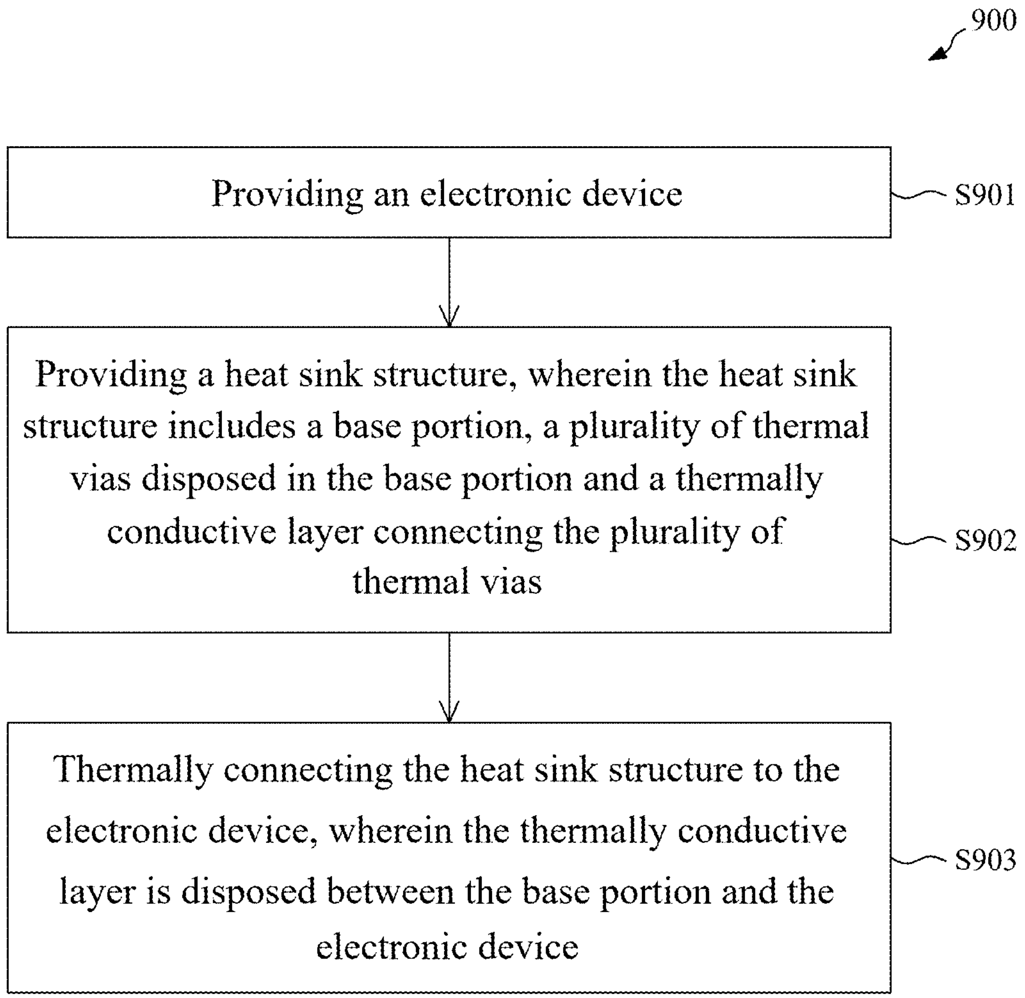
FIG. 1 illustrates, in a flowchart diagram form, a method for manufacturing a package structure in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being “connected to” or “coupled to” another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a package structure, an electronic device, a semiconductor electronic device or a semiconductor electronic structure may generally mean a device which can function by utilizing semiconductor characteristics.

FIG. 1 illustrates, in a flowchart diagram form, a method 900 for manufacturing a package structure 6' in accordance with one embodiment of the present disclosure. FIGS. 2 to 24 illustrate, in schematic cross-sectional view diagrams, a flow for manufacturing the package structure 6' in accordance with one embodiment of the present disclosure.

With reference to FIGS. 2 to 12, at step S901, an electronic device **6*a*** may be provided.

Figure 2:
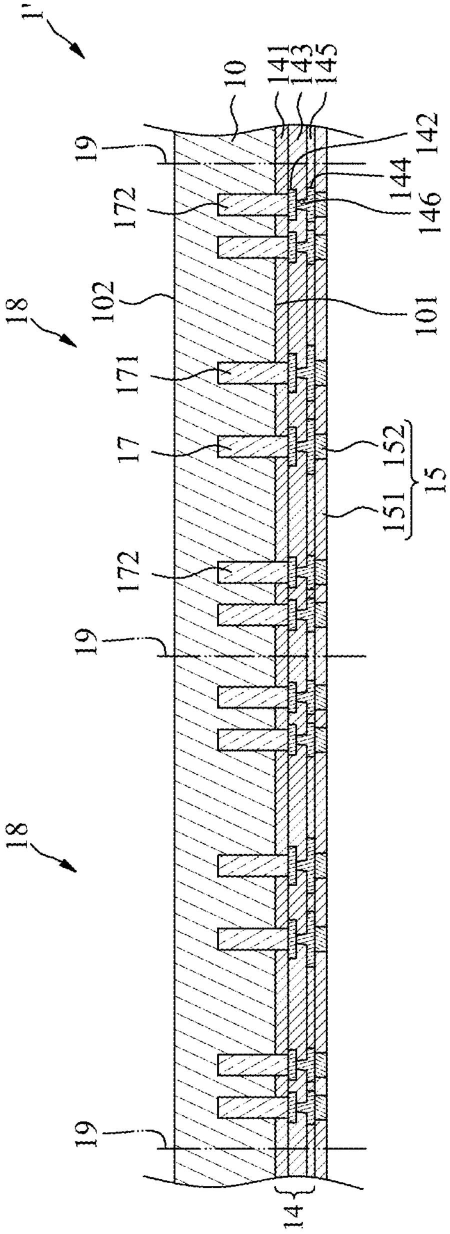
FIGS. 2 to 24 illustrate, in schematic cross-sectional view diagrams, a flow for manufacturing a package structure in accordance with one embodiment of the present disclosure.

With reference to FIG. 2, a first wafer 1' may be provided. The first wafer 1' may include a first base portion 10, a first conductive structure 14, a first lower structure 15 and a plurality of first conductive vias 17. The first wafer 1' may have a plurality of singulation lines 19 to define a plurality of units 18. The first base portion 10 may have a first surface 101 (e.g., a bottom surface) and a second surface 102 (e.g., a top surface) opposite to the first surface 101.

The first base portion 10 may be a semiconductor substrate, and may include, for example, silicon (Si), doped silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials, or combinations thereof. In some embodiments, the first base portion 10 may include a semiconductor-on-insulator substrate, such as a silicon-on-insulator (SOI) substrate, a silicon germanium-on-insulator (SGOI) substrate, or a germanium-on-insulator (GOI) substrate. In some embodiments, the first base portion 10 may be a bulk semiconductor substrate that is composed entirely of at least one semiconductor material; the bulk semiconductor substrate does not contain any dielectrics, insulating layers, or conductive features.

The first conductive structure 14 may be disposed on the first surface 101 (e.g., the bottom surface) of the first base portion 10. In some embodiments, the first conductive structure 14 may include a plurality of front-end-of-line (FEOL) devices, such as resistors, capacitors, inductors, diodes, p-type field-effect transistors (pFETs), n-type field-effect transistors (nFETs), metal-oxide semiconductor field-effect transistors (MOSFETs), complementary metal-oxide semiconductor (CMOS) transistors, bipolar junction transistors (BJTs), laterally-diffused MOS (LDMOS) transistors, high-voltage transistors, high-frequency transistors, fin field-effect transistors (FinFETs), other suitable IC components, or combinations thereof. In some embodiments, the first conductive structure 14 may further include at least one back-end-of-line (BEOL) interconnect pattern, e.g., a plurality of patterned circuit layers, electrically connected to the front-end-of-line (FEOL) devices. In some embodiments, the first conductive structure 14 may further include at least one dielectric layer or at least one dielectric structure covering the front-end-of-line (FEOL) devices and the back-end-of-line (BEOL) interconnect pattern.

The first conductive structure 14 may include a first dielectric layer 141, a first circuit layer (including a plurality traces and a plurality of pads 142), a second dielectric layer 143, a second circuit layer (including a plurality trace and a plurality of pads 144), a plurality of inner vias 146 and a third dielectric layer 145. The first dielectric layer 141 may be disposed on the first surface 101 (e.g., a bottom surface) of the first base portion 10. The first dielectric layer 141 may be an interlayer dielectric (ILD) layer, and may include $SiO_2$, SiN, and/or SiCN. The first circuit layer (including the traces and the pads 142) may be disposed on the first dielectric layer 141.

The second dielectric layer 143 may be disposed on the first dielectric layer 141 to cover the first circuit layer. The second dielectric layer 143 may be an inter-metal dielectric (IMD) layer, and may include $SiO_2$, SiN, and/or SiCN. The second circuit layer (including the traces and the pads 144) may be disposed on the second dielectric layer 143.

The inner vias 146 may be disposed in the second dielectric layer 143, and may connect the first circuit layer (e.g., the pads 142) and the second circuit layer (e.g., the pads 144). The third dielectric layer 145 may surround the second circuit layer (e.g., the pads 144). The third dielectric layer 145 may include $SiO_2$, SiN, and/or SiCN.

The first lower structure 15 may be disposed on the first conductive structure 14. The first lower structure 15 may include a first lower dielectric layer 151 and a plurality of first lower pads 152. The first lower pads 152 may be disposed on the second circuit layer (e.g., the pads 144), and may be embedded in the first lower dielectric layer 151. Each of the first lower pads 152 may be a hybrid bonding (HB) pad and may include Cu or Al. The first lower pads 152 may be exposed by the first lower dielectric layer 151. The first lower dielectric layer 151 may be a hybrid bonding (HB) dielectric layer, and may include $SiO_2$, SiN, and/or SICN.

The first conductive vias 17 may be disposed in the first base portion 10, and may extend beyond the first surface 101 (e.g., the bottom surface) of the first base portion 10. The first conductive vias 17 may extend through the first dielectric layer 141 to connect or contact the first circuit layer (e.g., the pads 142). Thus, the first conductive vias 17 may extend into the first conductive structure 14, and may be electrically connected to the first conductive structure 14. Thus, the first lower pads 152 may be electrically connected to the first conductive vias 17 through the first conductive structure 14.

In each of the units 18, the first conductive vias 17 may include a plurality of first center vias 171 disposed at a center portion of the unit 18 and a plurality of first periphery vias 172 disposed at a periphery portion of the unit 18. The periphery portion of the unit 18 may surround the center portion of the unit 18. In some embodiments, the first center vias 171 may be configured for signal transmission. The first periphery vias 172 may be configured for heat dissipation. A gap between the first center vias 171 may be greater than a gap between the first periphery vias 172.

Figure 3:
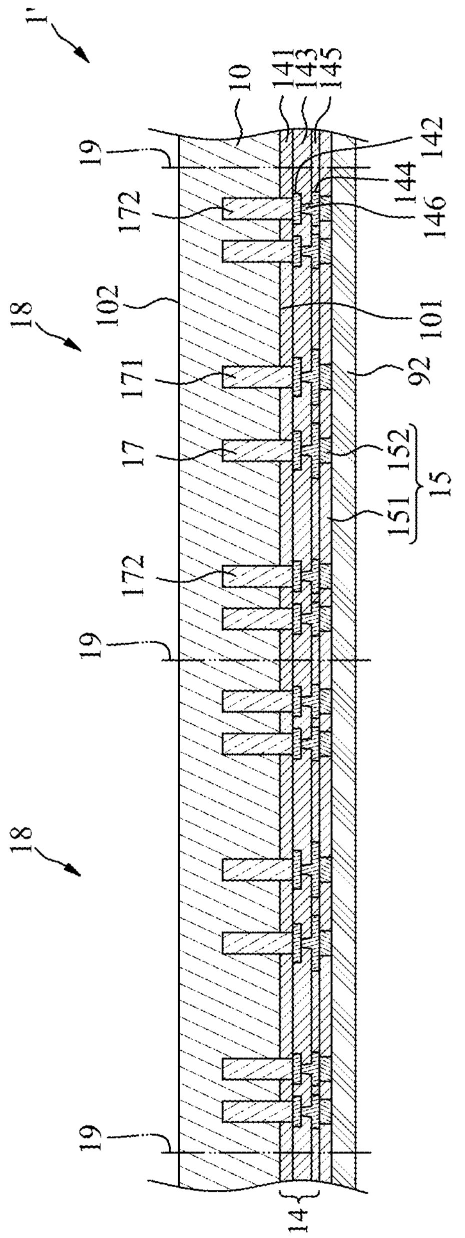

With reference to FIG. 3, the first wafer 1' may be attached to or bonded to a carrier 92. The first lower structure 15 of the first wafer 1' may contact the carrier 92. Thus, the first surface 101 (e.g., a bottom surface) of the first base portion 10 may face the carrier 92.

Figure 4:
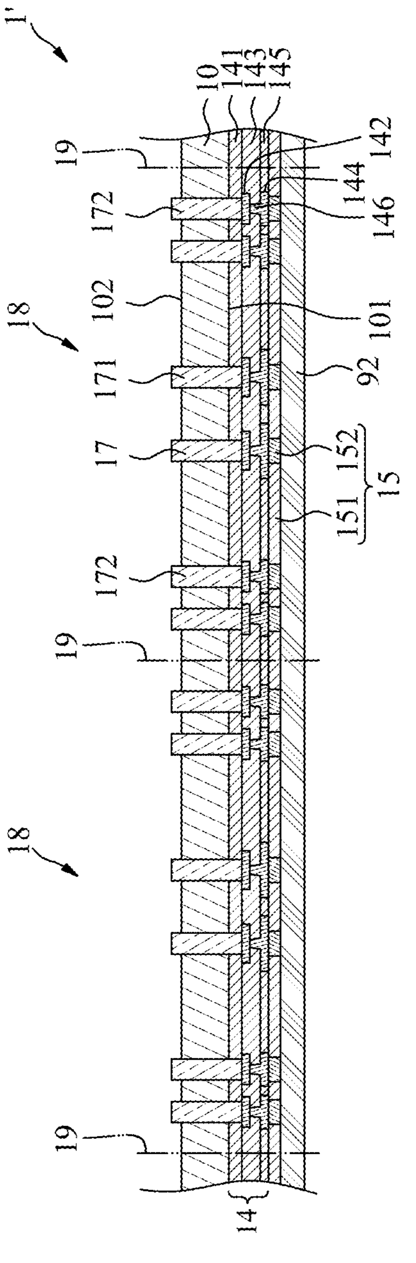

With reference to FIG. 4, the first base portion 10 may be thinned from its second surface 102 (e.g., the top surface) by grinding, chemical-mechanical Polishing (CMP) and etching, so as to expose the first conductive vias 17. Thus, the first conductive vias 17 may extend beyond the second surface 102 (e.g., the top surface) of the first base portion 10. The first conductive vias 17 may extend through the first base portion 10.

Figure 5:
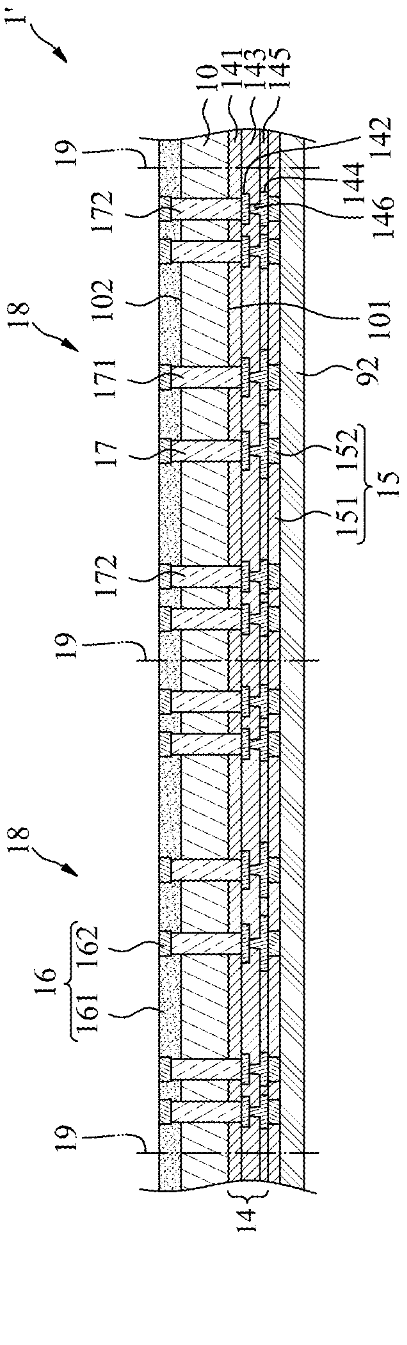

With reference to FIG. 5, a first upper structure 16 may be formed on the second surface 102 (e.g., the top surface) of the first base portion 10. The first upper structure 16 may include a first upper dielectric layer 161 and a plurality of first upper pads 162. The first upper dielectric layer 161 may be disposed on the second surface 102 (e.g., the top surface) of the first base portion 10, and may cover a top portion of the first conductive via 17. The first upper dielectric layer 161 may be a hybrid bonding (HB) dielectric layer, and may include $SiO_2$, SiN, and/or SiCN.

The first upper pads 162 may be embedded in the first upper dielectric layer 161, and may be exposed by the first upper dielectric layer 161. The first upper pads 162 may be electrically connected to the first conductive vias 17. In some embodiments, the first upper pads 162 may directly contact the first conductive vias 17. Each of the first upper pads 162 may be a hybrid bonding (HB) pad, and may include Cu or Al.

Figure 6:
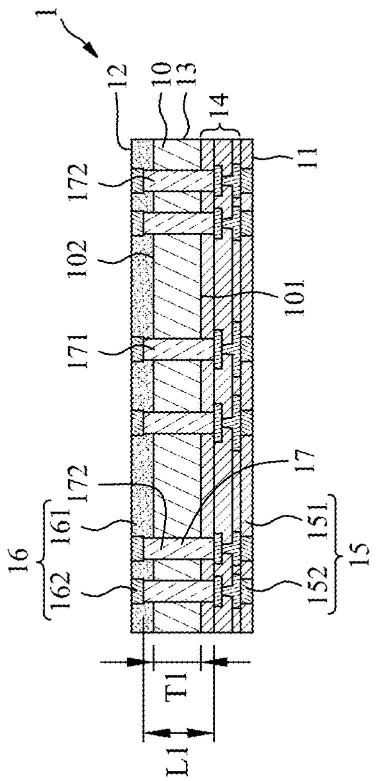

With reference to FIG. 6, the carrier 92 may be removed from the first wafer 1'. Then, the first wafer 1' may be singulated along the singulation lines 19 to form a plurality of first semiconductor chips 1. Each of the first semiconductor chips 1 corresponds to each of the units 18. The first semiconductor chip 1 has a first surface 11 (e.g., a bottom surface), a second surface 12 (e.g., a top surface) and a lateral surface 13 extending between the first surface 11 (e.g., the bottom surface) and the second surface 12 (e.g., the top surface). A length L1 of the first conductive via 17 may be greater than a thickness T1 of the first base portion 10.

Figure 7:
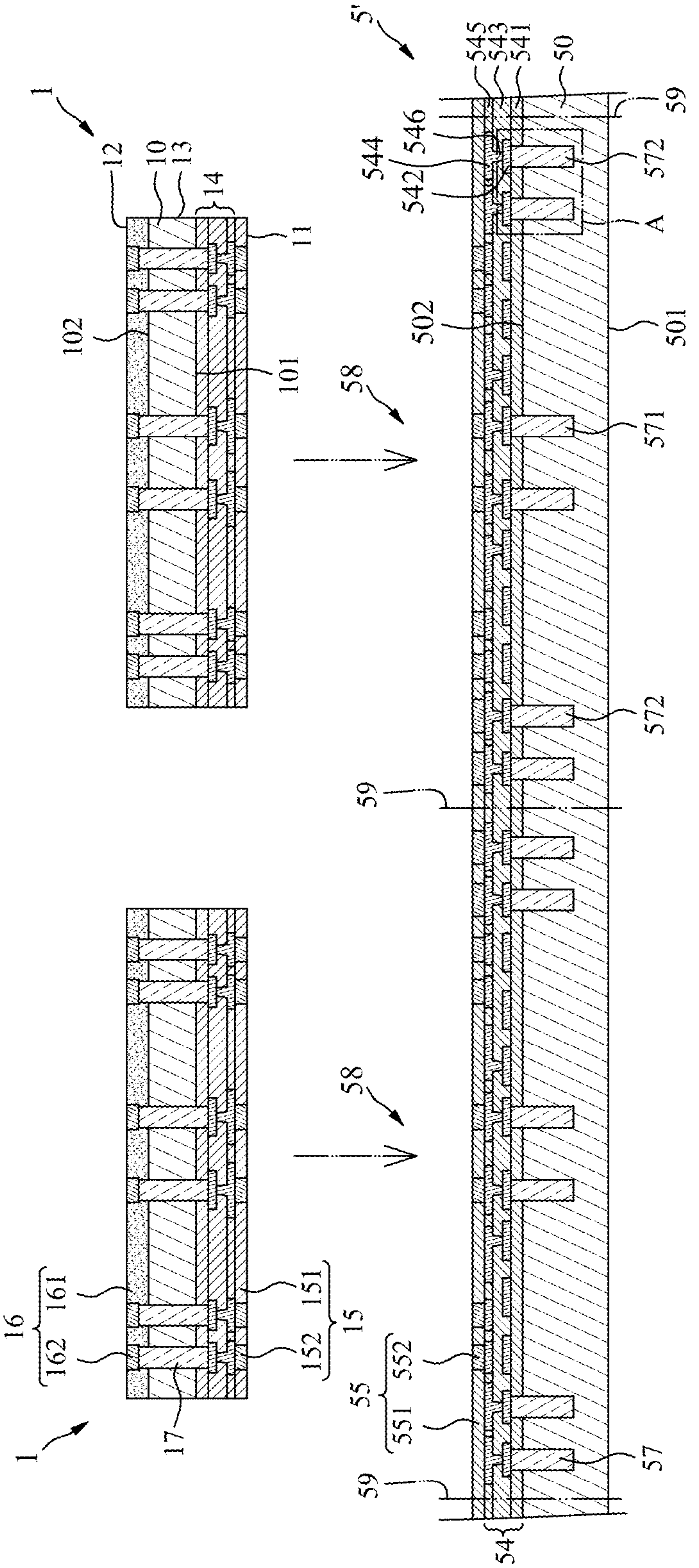

With reference to FIG. 7, a fifth wafer 5' may be provided. The fifth wafer 5' may include a fifth base portion 50, a fifth conductive structure 54, a fifth upper structure 55 and a plurality of fifth conductive vias 57. The fifth wafer 5' may have a plurality of singulation lines 59 to define a plurality of units 58. The fifth base portion 50 may have a first surface 501 (e.g., a bottom surface) and a second surface 502 (e.g., a top surface) opposite to the first surface 501.

The fifth base portion 50 may be a semiconductor substrate, and may include, for example, silicon (Si), doped silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials, or combinations thereof. In some embodiments, the fifth base portion 50 may include a semiconductor-on-insulator substrate, such as a silicon-on-insulator (SOI) substrate, a silicon germanium-on-insulator (SGOI) substrate, or a germanium-on-insulator (GOI) substrate. In some embodiments, the fifth base portion 50 may be a bulk semiconductor substrate that is composed entirely of at least one semiconductor material; the bulk semiconductor substrate does not contain any dielectrics, insulating layers, or conductive features.

The fifth conductive structure 54 may be disposed on the second surface 502 (e.g., the top surface) of the fifth base portion 50. In some embodiments, the fifth conductive structure 54 may include a plurality of front-end-of-line (FEOL) devices, such as resistors, capacitors, inductors, diodes, p-type field-effect transistors (pFETs), n-type field-effect transistors (nFETs), metal-oxide semiconductor field-effect transistors (MOSFETs), complementary metal-oxide semiconductor (CMOS) transistors, bipolar junction transistors (BJTs), laterally-diffused MOS (LDMOS) transistors, high-voltage transistors, high-frequency transistors, fin field-effect transistors (FinFETs), other suitable IC components, or combinations thereof. In some embodiments, the fifth conductive structure 54 may further include at least one back-end-of-line (BEOL) interconnect pattern, e.g., a plurality of patterned circuit layers, electrically connected to the front-end-of-line (FEOL) devices. In some embodiments, the fifth conductive structure 54 may further include at least one dielectric layer or at least one dielectric structure covering the front-end-of-line (FEOL) devices and the back-end-of-line (BEOL) interconnect pattern.

The fifth conductive structure 54 may include a first dielectric layer 541, a first circuit layer (including a plurality traces and a plurality of pads 542), a second dielectric layer 543, a second circuit layer (including a plurality trace and a plurality of pads 544), a plurality of inner vias 546 and a third dielectric layer 545. The first dielectric layer 541 may be disposed on the second surface 502 (e.g., the top surface) of the fifth base portion 50. The first dielectric layer 541 may be an interlayer dielectric (ILD) layer, and may include $SiO_2$, SiN, and/or SiCN. The first circuit layer (including the traces and the pads 542) may be disposed on the first dielectric layer 541.

The second dielectric layer 543 may be disposed on the first dielectric layer 541 to cover the first circuit layer. The second dielectric layer 543 may be an inter-metal dielectric (IMD) layer, and may include $SiO_2$, SiN, and/or SiCN. The second circuit layer (including the traces and the pads 544) may be disposed on the second dielectric layer 543.

The inner vias 546 may be disposed in the second dielectric layer 543, and may connect the first circuit layer (e.g., the pads 542) and the second circuit layer (e.g., the pads 544). The third dielectric layer 545 may surround the second circuit layer (e.g., the pads 544). The third dielectric layer 545 may include $SiO_2$, SiN, and/or SiCN.

The fifth upper structure 55 may be disposed on the fifth conductive structure 54. The fifth upper structure 55 may include a fifth upper dielectric layer 551 and a plurality of fifth upper pads 552. The fifth upper pads 552 may be disposed on the second circuit layer (e.g., the pads 544), and may be embedded in the fifth upper dielectric layer 551. Each of the fifth upper pads 552 may be a hybrid bonding (HB) pad and may include Cu or Al. The fifth upper pads 552 may be exposed by the fifth upper dielectric layer 551. The fifth upper dielectric layer 551 may be a hybrid bonding (HB) dielectric layer, and may include $SiO_2$, SiN, and/or SiCN.

The fifth conductive vias 57 may be disposed in the fifth upper base portion 50, and may extend beyond the second surface 502 (e.g., the top surface) of the fifth base portion 50. The fifth conductive vias 57 may extend through the first dielectric layer 541 to connect or contact the first circuit layer (e.g., the pads 542). Thus, the fifth conductive vias 57 may extend into the fifth conductive structure 54, and may be electrically connected to the fifth conductive structure 54. Thus, the fifth upper pads 552 may be electrically connected to the fifth conductive vias 57 through the fifth conductive structure 54.

In each of the units 58, the fifth conductive vias 57 may include a plurality of fifth center vias 571 disposed at a center portion of the unit 58 and a plurality of fifth periphery vias 572 disposed at a periphery portion of the unit 58. The periphery portion of the unit 58 may surround the center portion of the unit 58. In some embodiments, the fifth center vias 571 may be configured for signal transmission. The fifth periphery vias 572 may be configured for heat dissipation. A gap between the fifth center vias 571 may be greater than a gap between the fifth periphery vias 572.

Figure 8:
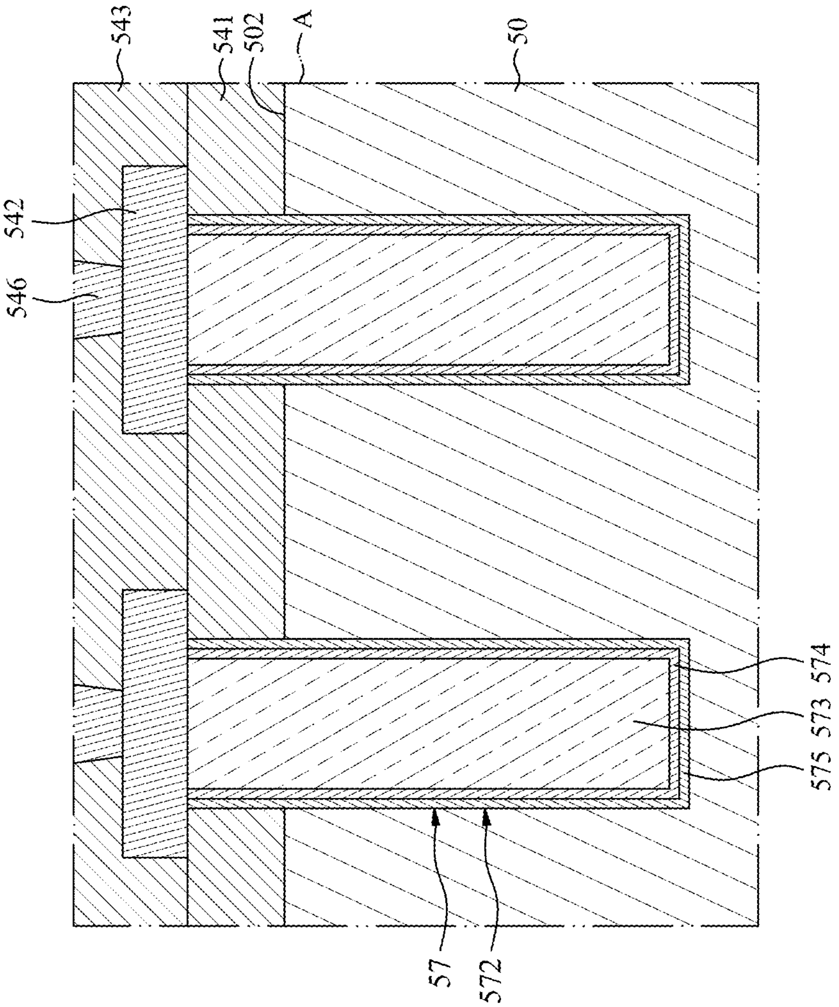

With reference to FIG. 8, an enlarged view of an area "A" of FIG. 7 is illustrated. The fifth conductive via 57 (e.g., the fifth center via 571 or the fifth periphery via 572) may include a conductive material 573, a barrier layer 574 and a liner 575. The conductive material 573 may include metal such as copper (Cu) or other suitable material. The barrier layer 574 may include tantalum (Ta) or titanium (Ti), and may surround the conductive material 573. The liner 575 may include oxide material such as silicon oxide ($SiO_2$), and may surround the barrier layer 574. A thickness of the barrier layer 574 may be substantially equal to a thickness of the liner 575.

Figure 9:
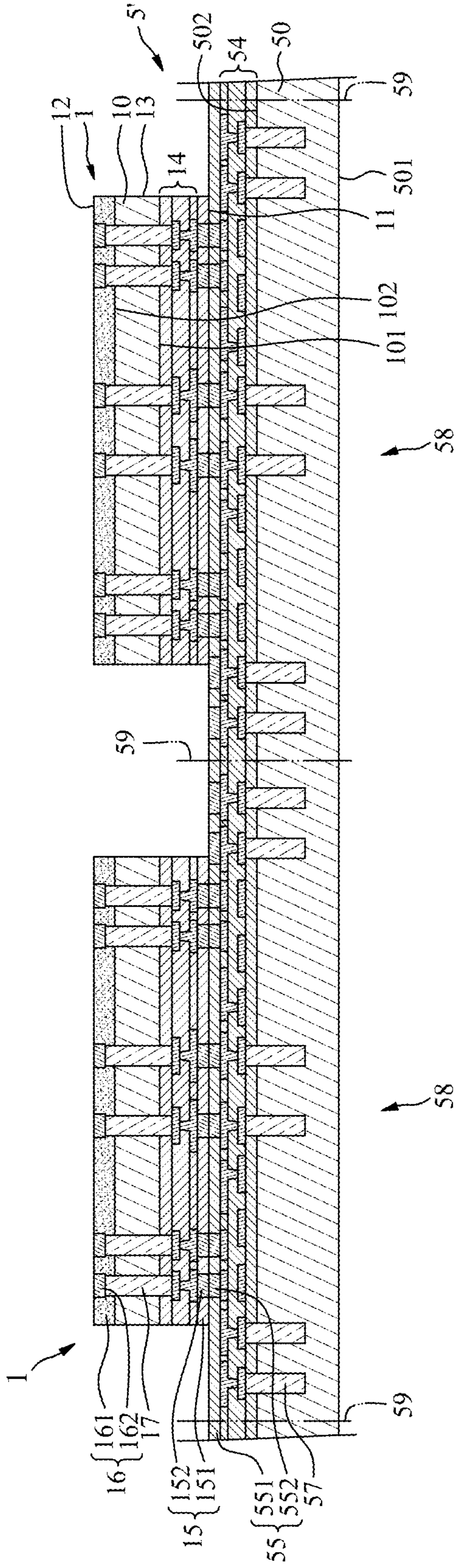

With reference to FIG. 9, a plurality of first semiconductor chips 1 may be attached to the units 58 of the fifth wafer 5' by hybrid bonding. The first surface 11 of the first semiconductor chip 1 may directly contact the fifth upper structure 55 of the fifth wafer 5'. The first lower dielectric layer 151 of the first lower structure 15 of the first semiconductor chip 1 may be adhered to the fifth upper dielectric layer 551 of the fifth upper structure 55 of the fifth wafer 5'. The first lower pads 152 of the first lower structure 15 of the first semiconductor chip 1 may be attached to the fifth upper pads 552 of the fifth upper structure 55 of the fifth wafer 5' by metal-to-metal bonding.

Figure 10:
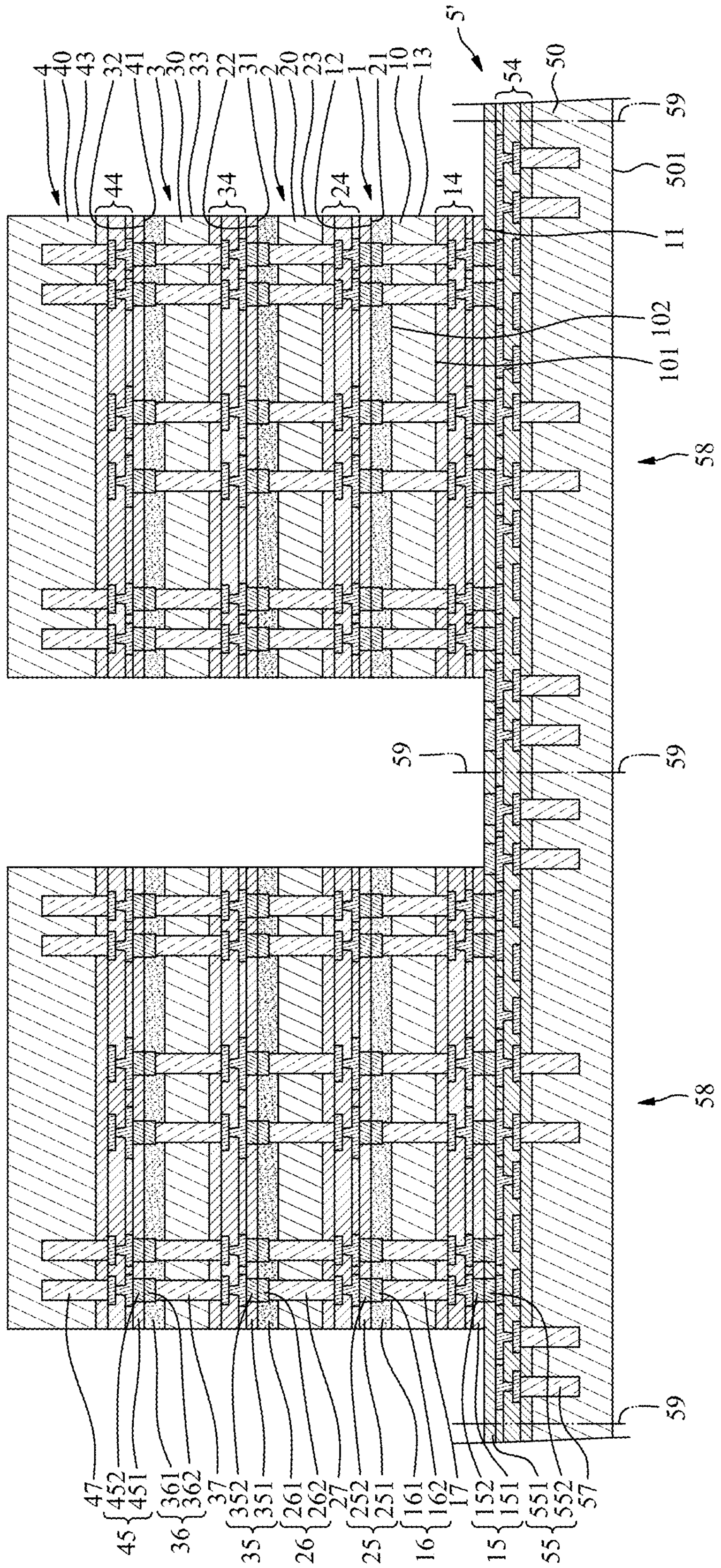

With reference to FIG. 10, a plurality of second semiconductor chips 2 may be attached to the first semiconductor chips 1 by hybrid bonding. The structure of the second semiconductor chip 2 may be same as or similar to the structure of the first semiconductor chip 1. The second semiconductor chip 2 has a first surface 21 (e.g., a bottom surface), a second surface 22 (e.g., a top surface) and a lateral surface 23 extending between the first surface 21 (e.g., the bottom surface) and the second surface 22 (e.g., the top surface).

The second semiconductor chip 2 may include a second base portion 20, a second conductive structure 24, a second lower structure 25, a second upper structure 26 and a plurality of second conductive vias 27 that are same as the first base portion 10, the first conductive structure 14, the first lower structure 15, the first upper structure 16 and the first conductive vias 17 of the first semiconductor chip 1, respectively.

The second conductive vias 27 may include a plurality of second center vias disposed at a center portion of the second semiconductor chip 2 and a plurality of second periphery vias disposed at a periphery portion of the second semiconductor chip 2. In some embodiments, the second center vias may be configured for signal transmission, and may correspond to the first center vias 171. The second periphery vias may be configured for heat dissipation, and may correspond to the first periphery vias 172.

The first surface 21 of the second semiconductor chip 2 may directly contact the second surface 12 of the first semiconductor chip 1. The second lower dielectric layer 251 of the second lower structure of the second semiconductor chip 2 may be adhered to the first upper dielectric layer 161 of the first upper structure 16 of the first semiconductor chip 1. The second lower pads 252 of the second lower structure 25 of the second semiconductor chip 2 may be attached to the first upper pads 162 of the first upper structure 16 of the first semiconductor chip 1 by metal-to-metal bonding.

Then, a plurality of third semiconductor chips 3 may be attached to the second semiconductor chips 2 by hybrid bonding. The structure of the third semiconductor chip 3 may be same as or similar to the structure of the first semiconductor chip 1. The third semiconductor chip 3 has a first surface 31 (e.g., a bottom surface), a second surface 32 (e.g., a top surface) and a lateral surface 33 extending between the first surface 31 (e.g., the bottom surface) and the second surface 32 (e.g., the top surface).

The third semiconductor chip 3 may include a third base portion 30, a third conductive structure 34, a third lower structure 35, a third upper structure 36 and a plurality of third conductive vias 37 that are same as the first base portion 10, the first conductive structure 14, the first lower structure 15, the first upper structure 16 and the first conductive vias 17 of the first semiconductor chip 1, respectively.

The third conductive vias 37 may include a plurality of third center vias disposed at a center portion of the third semiconductor chip 3 and a plurality of third periphery vias disposed at a periphery portion of the third semiconductor chip 3. In some embodiments, the third center vias may be configured for signal transmission, and may correspond to the second center vias and the first center vias 171. The third periphery vias may be configured for heat dissipation, and may correspond to the second periphery vias and the first periphery vias 172.

The first surface 31 of the third semiconductor chip 3 may directly contact the second surface 22 of the second semiconductor chip 2. The third lower dielectric layer 351 of the third lower structure 35 of the third semiconductor chip 3 may be adhered to the second upper dielectric layer 261 of the second upper structure 26 of the second semiconductor chip 2. The third lower pads 352 of the third lower structure 35 of the third semiconductor chip 3 may be attached to the second upper pads 262 of the second upper structure 26 of the second semiconductor chip 2 by metal-to-metal bonding.

Then, a plurality of fourth semiconductor chips 4 may be attached to the third semiconductor chips 3 by hybrid bonding. The structure of the fourth semiconductor chip 4 may be similar to the structure of the first semiconductor chip 1. The fourth semiconductor chip 4 has a first surface 41 (e.g., a bottom surface), a second surface 42 (e.g., a top surface) and a lateral surface 43 extending between the first surface 41 (e.g., the bottom surface) and the second surface 42 (e.g., the top surface).

The fourth semiconductor chip 4 may include a fourth base portion 40, a fourth conductive structure 44, a fourth lower structure 45 and a plurality of fourth conductive vias 47 that are same as the first base portion 10, the first conductive structure 14, the first lower structure 15 and the first conductive vias 17 of the first semiconductor chip 1, respectively.

The fourth conductive vias 47 may include a plurality of fourth periphery vias disposed at a periphery portion of the fourth semiconductor chip 4. In some embodiments, the fourth periphery vias may be configured for heat dissipation, and may correspond to the third periphery vias, the second periphery vias and the first periphery vias 172.

The first surface 41 of the fourth semiconductor chip 4 may directly contact the second surface 32 of the third semiconductor chip 3. The fourth lower dielectric layer 451 of the fourth lower structure 45 of the fourth semiconductor chip 4 may be adhered to the third upper dielectric layer 361 of the third upper structure 36 of the third semiconductor chip 3. The fourth lower pads 452 of the fourth lower structure 45 of the fourth semiconductor chip 4 may be attached to the third upper pads 362 of the third upper structure 36 of the third semiconductor chip 3 by metal-to-metal bonding.

Figure 11:
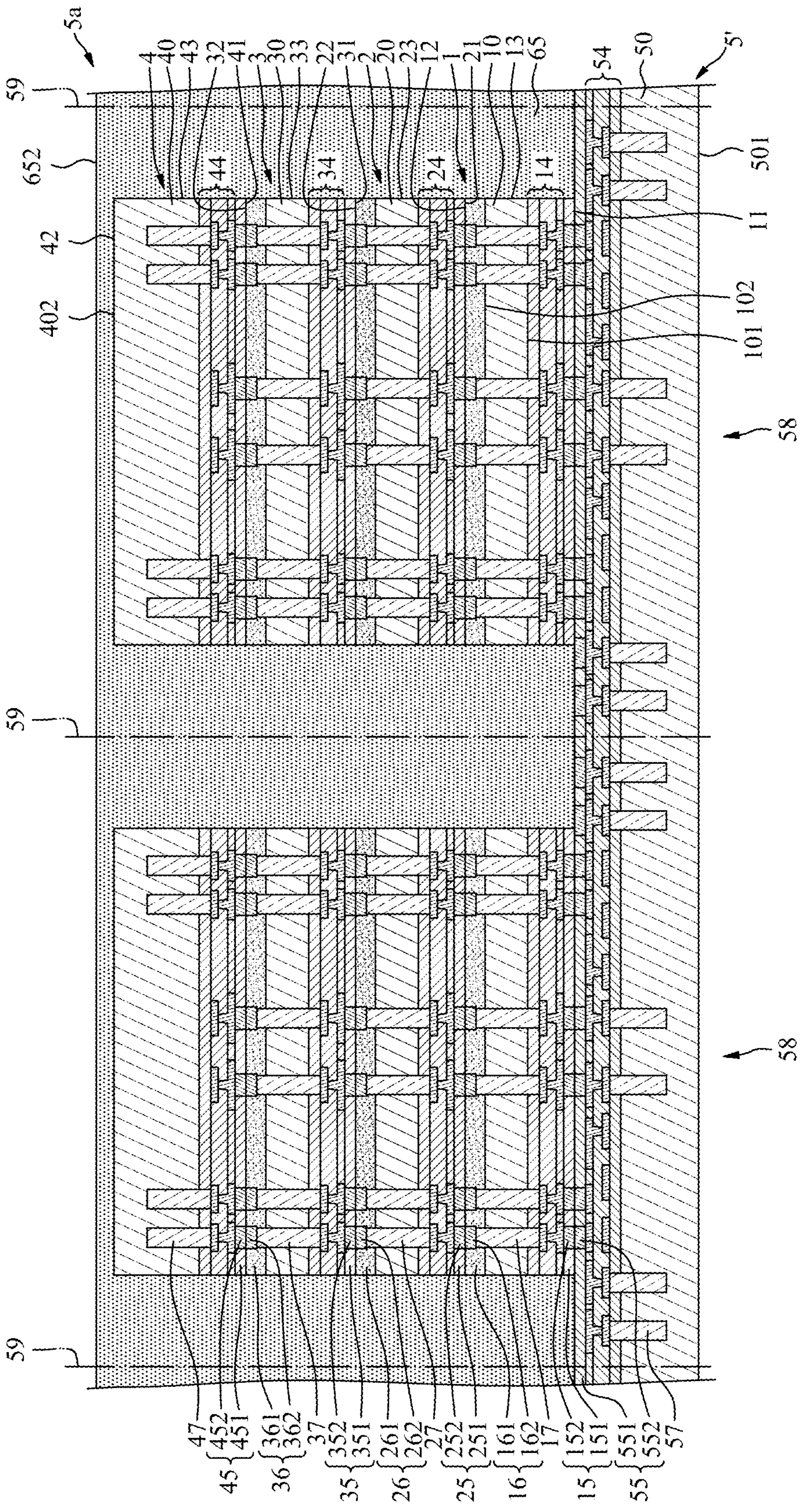

With reference to FIG. 11, an encapsulant 65 may be formed on the fifth wafer 5' to cover and encapsulate the stacked first semiconductor chips 1, second semiconductor chips 2, third semiconductor chips 3 and fourth semiconductor chips 4. The encapsulant 65 may include a molding compound with or without fillers. The encapsulant 65 may have a top surface 652. Meanwhile, a molded structure **5*a*** may be formed.

Figure 12:
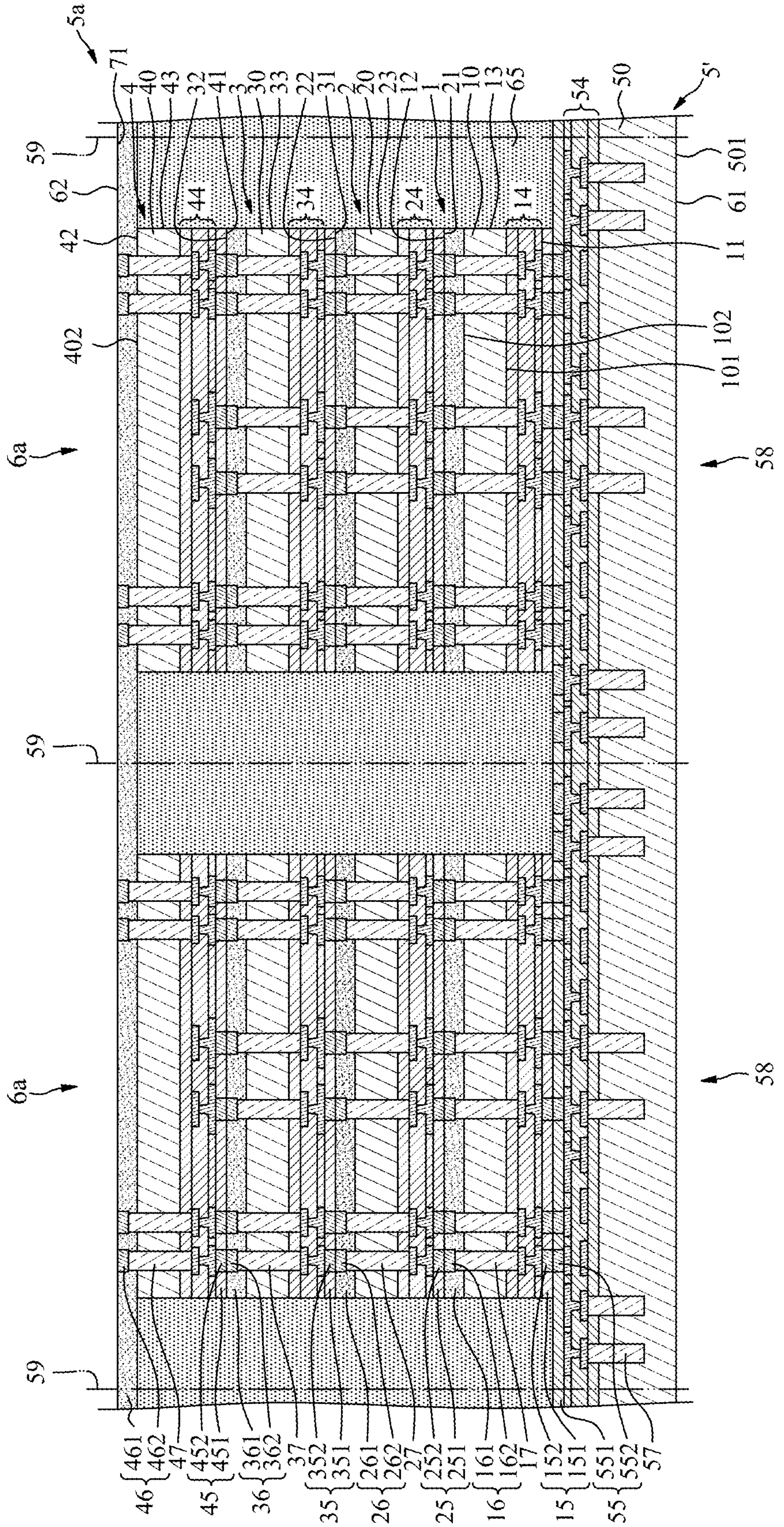

With reference to FIG. 12, the encapsulant 65 may be thinned from its top surface 652. Meanwhile, the fourth base portion 40 may be thinned from its second surface 402 (e.g., the top surface) by grinding, chemical-mechanical Polishing (CMP) and etching, so as to expose the fourth conductive vias 47. Thus, the fourth conductive vias 47 may extend beyond the second surface 402 (e.g., the top surface) of the fourth base portion 40, and the top surface 652 of the encapsulant 65 may be substantially coplanar with the second surface 402 (e.g., the top surface) of the fourth base portion 40.

Then, a fourth upper structure 46 may be formed on the second surface 402 (e.g., the top surface) of the fourth base portion 40 and the top surface 652 of the encapsulant 65. The fourth upper structure 46 may include a fourth upper dielectric layer 461 and a plurality of fourth upper pads 462. The fourth upper dielectric layer 461 may be disposed on the second surface 402 (e.g., the top surface) of the fourth base portion 40 and the top surface 652 of the encapsulant 65, and may cover a top portion of the fourth conductive via 47. The fourth upper dielectric layer 461 may be a hybrid bonding (HB) dielectric layer, and may include $SiO_2$, SiN, and/or SiCN.

The fourth upper pads 462 may be embedded in the fourth upper dielectric layer 461, and may be exposed by the fourth upper dielectric layer 461. The fourth upper pads 462 may be electrically connected to the fourth conductive vias 47. In some embodiments, the fourth upper pads 462 may directly contact the fourth conductive vias 47. Each of the fourth upper pads 462 may be a hybrid bonding (HB) pad, and may include Cu or Al.

Meanwhile, the molded structure **5*a* may include a plurality of units 6*a* (corresponding to the units 58) defined by the singulation lines 59. Each of the units 6*a* may be an electronic device 6*a* having a first surface 61 (e.g., a bottom surface) and a second surface 62 (e.g., a top surface) opposite to the first surface 61**.

Figure 13:
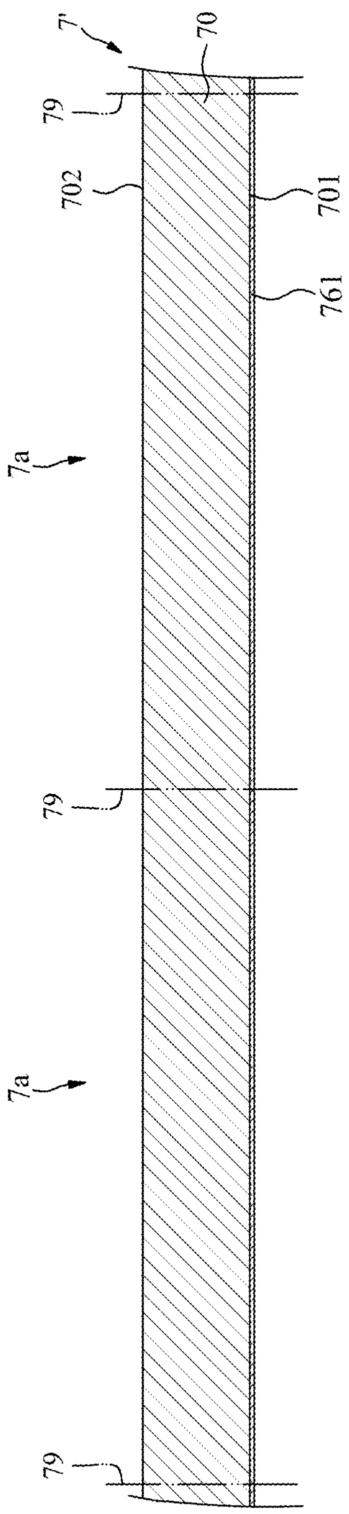

With reference to FIG. 1 and FIGS. 13 to 18, at step S902, a heat sink structure 7 may be provided. With reference to FIG. 13, a sixth wafer 7' may be provided. The sixth wafer 7' may include a sixth base portion 70 and a first dielectric layer 761. The sixth wafer 7' may have a plurality of singulation lines 79 to define a plurality of units **7*a*. The sixth base portion 70 may be also referred to as "a base portion 70". The sixth base portion 70 may have a first surface 701 (e.g., a bottom surface) and a second surface 702 (e.g., a top surface) opposite to the first surface 701**.

The sixth base portion 70 may be a semiconductor substrate, and may include, for example, silicon (Si), doped silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials, or combinations thereof.

In some embodiments, the sixth base portion 70 may include a semiconductor-on-insulator substrate, such as a silicon-on-insulator (SOI) substrate, a silicon germanium-on-insulator (SGOI) substrate, or a germanium-on-insulator (GOI) substrate. In some embodiments, the sixth base portion 70 may be a bulk semiconductor substrate that is composed entirely of at least one semiconductor material; the bulk semiconductor substrate does not contain any dielectrics, insulating layers, or conductive features.

The first dielectric layer 761 may be disposed on the first surface 701 (e.g., the bottom surface) of the sixth base portion 70. The first dielectric layer 761 may include $SiO_2$, SiN, and/or SiCN.

Figure 14:
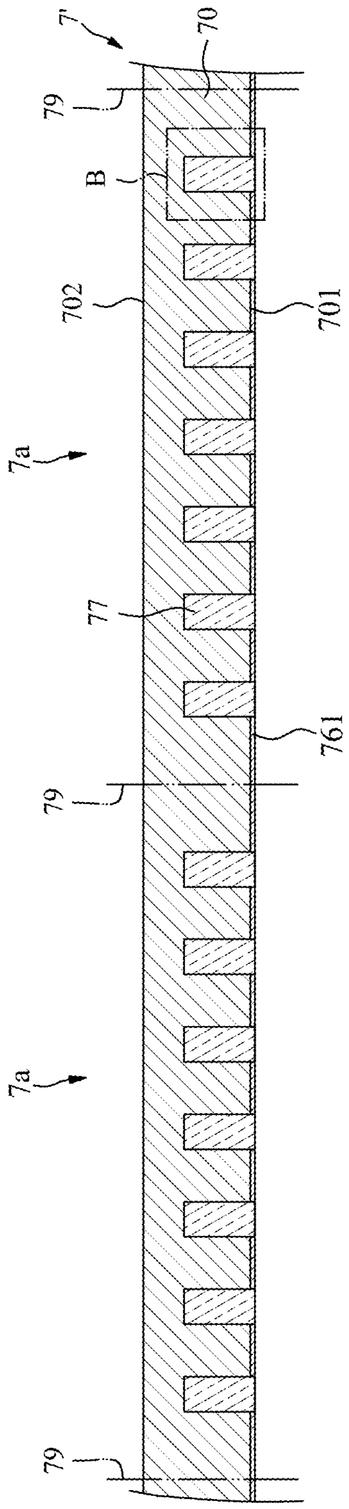

With reference to FIG. 14, a plurality of thermal vias 77 may be formed to extend through the first dielectric layer 761 and extend into the sixth base portion 70. The thermal vias 77 may be configured for heat dissipation.

Figure 15:
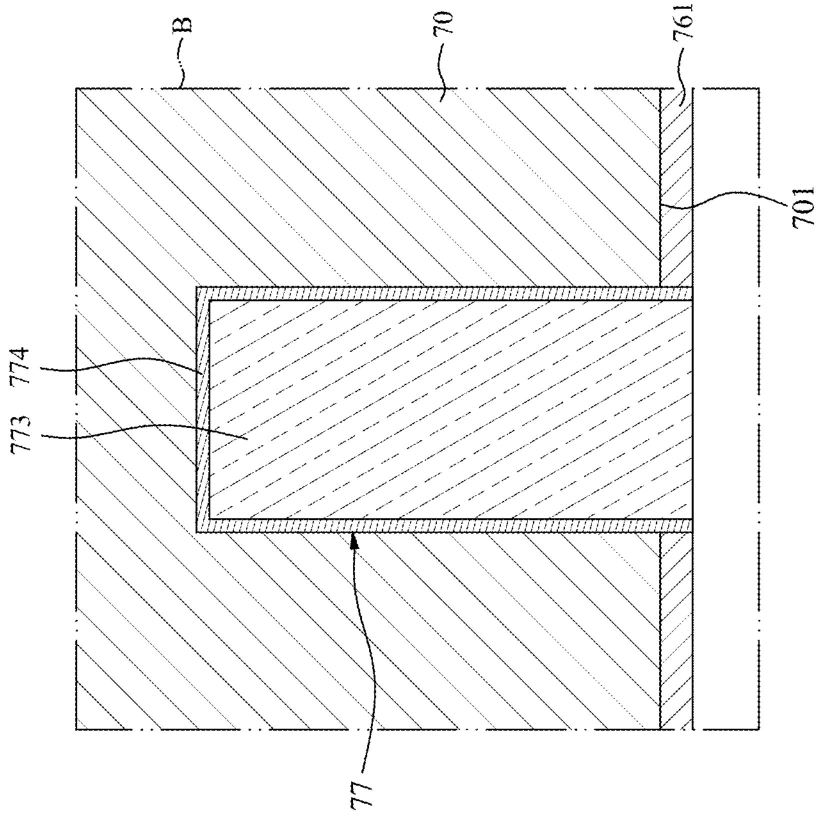

With reference to FIG. 15, an enlarged view of an area "B" of FIG. 14 is illustrated. The thermal via 77 may include a conductive material 773 and a barrier layer 774. The conductive material 773 may include metal such as copper (Cu) or other suitable material. The barrier layer 774 may include tantalum (Ta) or titanium (Ti), and may surround the conductive material 773.

Figure 16:
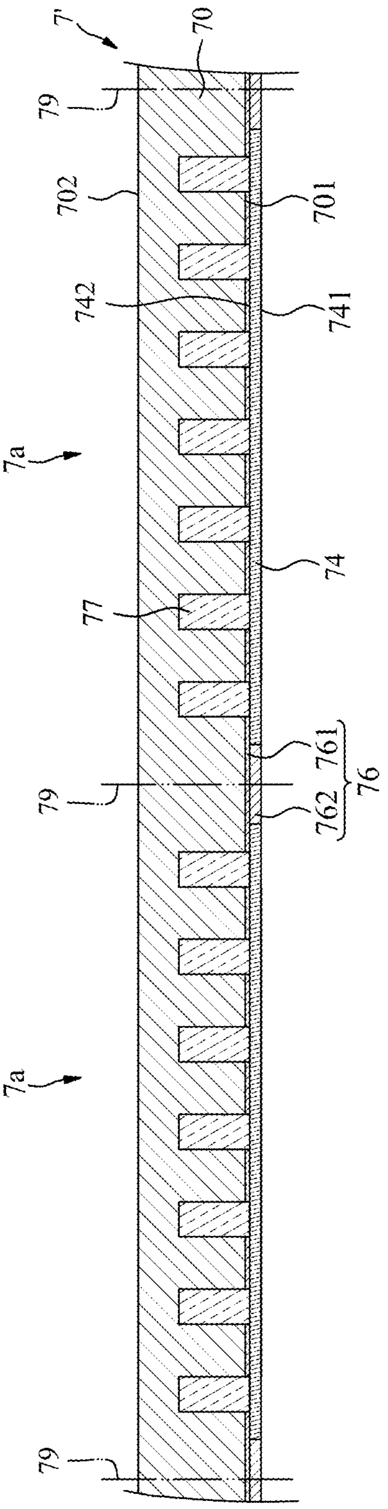

With reference to FIG. 16, a thermally conductive layer 74 and a second dielectric layer 762 may be formed on the first dielectric layer 761. The thermally conductive layer 74 may include metal such as copper (Cu) or other suitable material. The material of the thermally conductive layer 74 may be the same as or different from the material of thermal vias 77. The thermally conductive layer 74 may cover and contact the thermal vias 77. Thus, the thermal vias 77 may directly contact the thermally conductive layer 74.

The second dielectric layer 762 may surround the thermally conductive layer 74. The first dielectric layer 761 and the second dielectric layer 762 may collectively form a dielectric structure 76. The dielectric structure 76 may be disposed on the first surface 701 of the sixth base portion 70, and may encapsulate the thermally conductive layer 74. The thermally conductive layer 74 may be spaced apart from the sixth base portion 70 by the first dielectric layer 761 of the dielectric structure 76. Thus, a portion of the dielectric structure 76 is disposed between the thermally conductive layer 74 and the sixth base portion 70.

Figure 17:
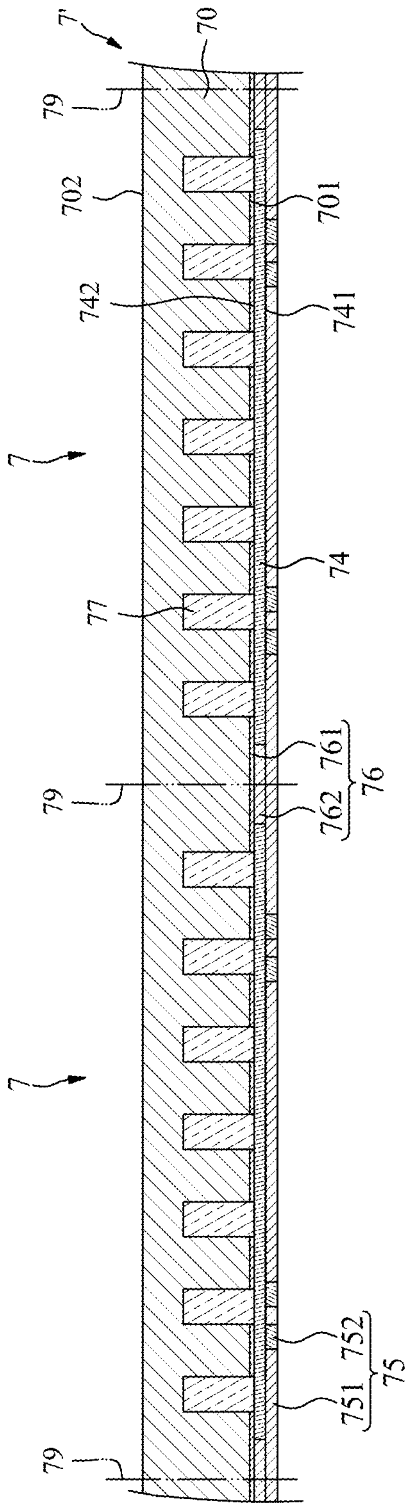

With reference to FIG. 17, a lower structure 75 (e.g., a sixth lower structure 75) may be formed or disposed on the thermally conductive layer 74 and the dielectric structure 76. The lower structure 75 may include a lower dielectric layer 751 (e.g., a sixth lower dielectric layer 751) and a plurality of lower pads 752 (e.g., a plurality of sixth lower pads 752). The lower pads 752 may be disposed on the thermally conductive layer 74, and may be embedded in the lower dielectric layer 751. Each of the lower pads 752 may be a hybrid bonding (HB) pad and may include Cu or Al. The lower pads 752 may be exposed by the lower dielectric layer

751. The lower dielectric layer 751 may be a hybrid bonding (HB) dielectric layer, and may include $SiO_2$, SiN, and/or SiCN.

The thermal vias 77 connect to a second surface 742 (e.g. a top surface) of the thermally conductive layer 74. The lower pads 752 connect to a first surface 741 (e.g. a bottom surface) of the thermally conductive layer 74 opposite to the second surface 742.

Figure 18:
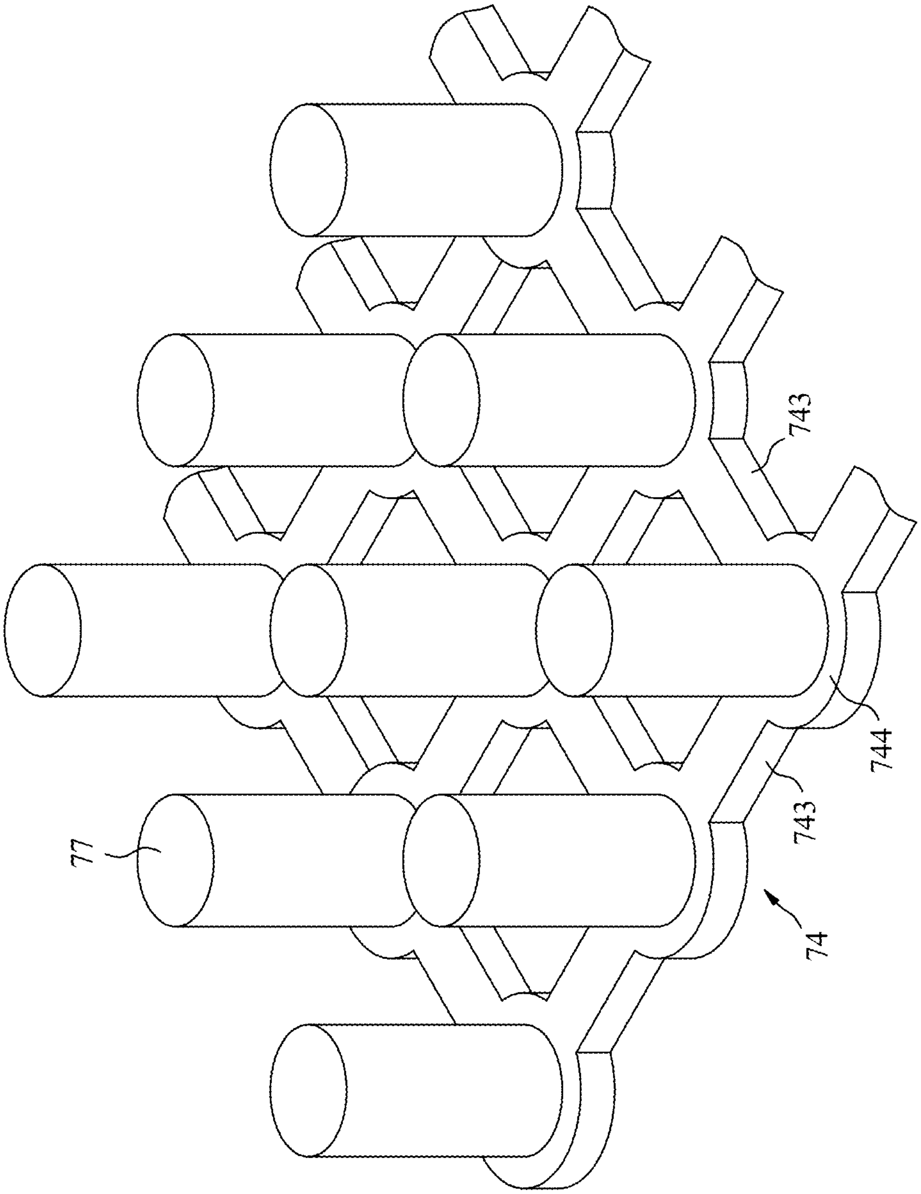

Meanwhile, the structure corresponding to each of the units 7*a* is a heat sink structure 7. Thus, the sixth wafer 7' may include a plurality of heat sink structures 7 defined by the singulation lines 79. With reference to FIG. 18, a partially perspective view of the thermally conductive layer 74 and the thermal vias 77 of FIG. 17 is illustrated. The thermally conductive layer 74 may have a net shape. That is, the thermally conductive layer 74 may include a plurality of lines 743 crossed with each other to form a plurality of intersection portions 744. The thermal vias 77 are connected to the intersection portions 744 of the thermally conductive layer 74. However, in some embodiments, the thermally conductive layer 74 may have a plate shape or a sheet shape.

Figure 19:
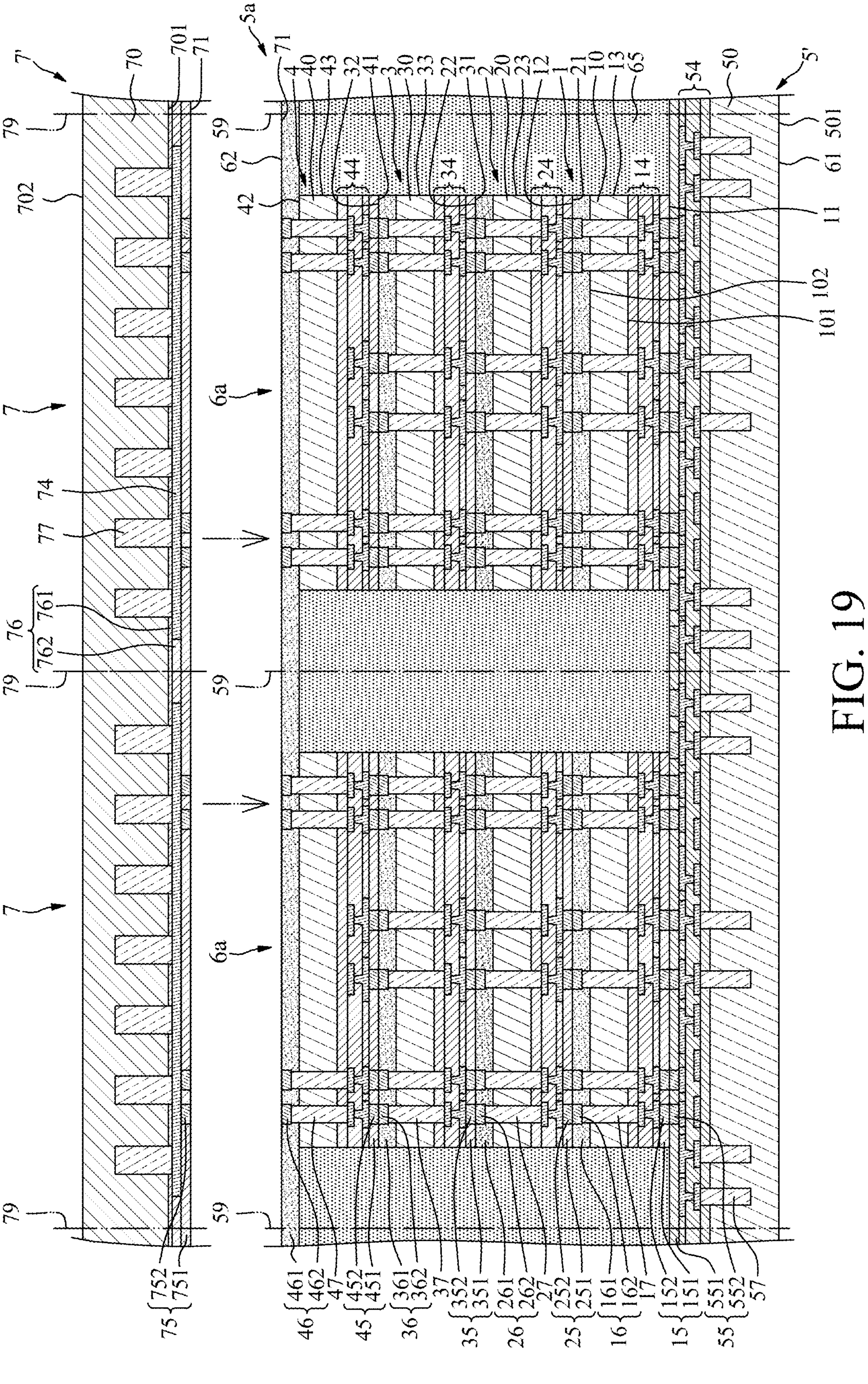
Figure 20:
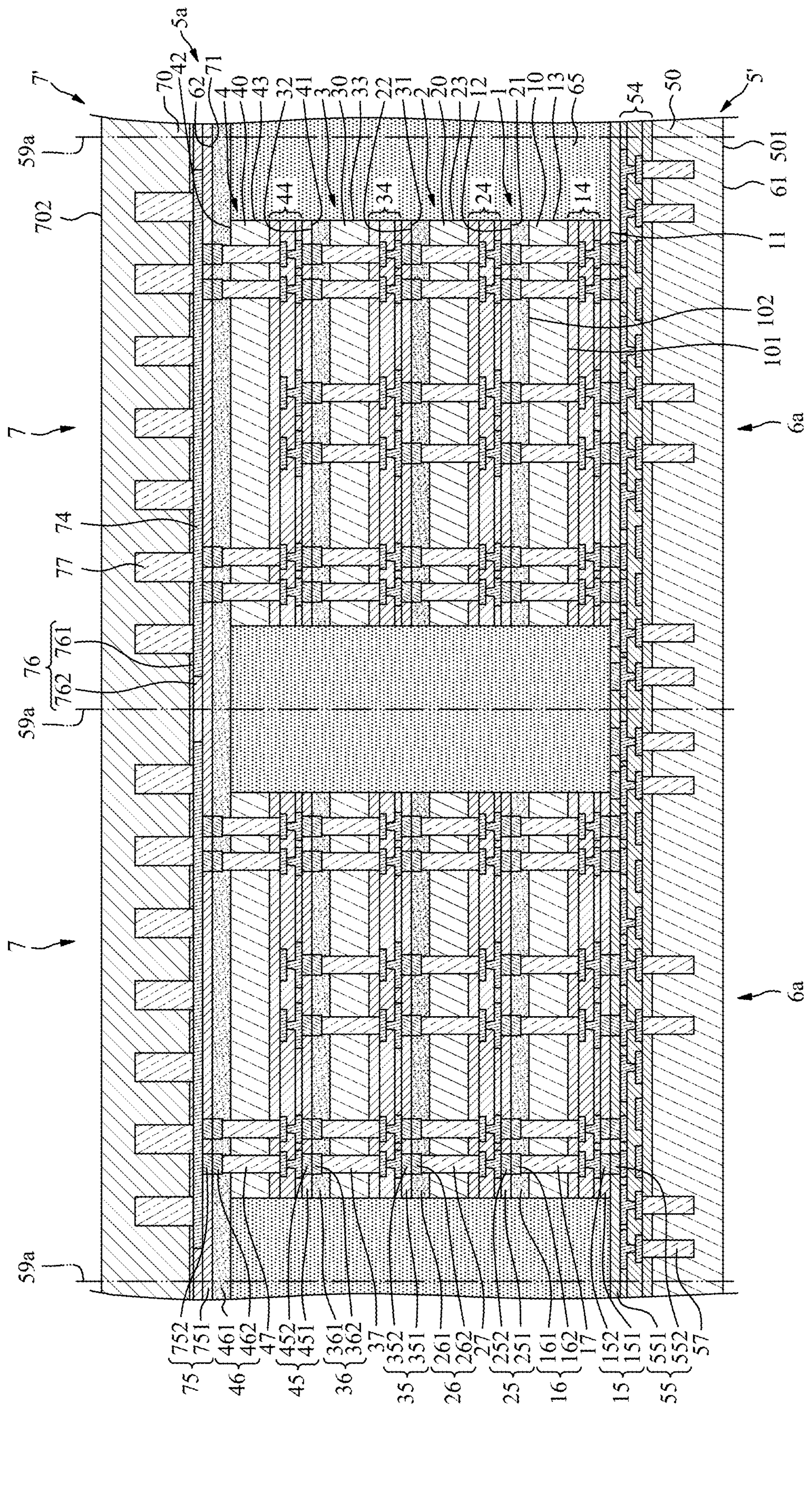

With reference to FIG. 1 and FIGS. 19 to 24, at step S903, the heat sink structure 7 may be thermally connected to the electronic device 6, and the thermally conductive layer 74 may be disposed between the sixth base portion 70 and the electronic device 6. With reference to FIGS. 19 and 20, the sixth wafer 7' of FIG. 17 is attached to the molded structure 5*a* of FIG. 12 by hybrid bonding.

The first surface 71 of the heat sink structure 7 of the sixth wafer 7' may directly contact the second surface 62 (e.g., the top surface) of the electronic device 6*a* of the molded structure 5*a*. The lower dielectric layer 751 (e.g., the sixth lower dielectric layer 751) of the lower structure 75 of the heat sink structure 7 may be adhered to the fourth upper dielectric layer 461 of the fourth upper structure 46 of the electronic device 6*a* of the molded structure 5*a*. The lower pads 752 (e.g., the sixth lower pads 752) of the lower structure 75 of the heat sink structure 7 may be attached to and thermally connected to the fourth upper pads 462 of the fourth upper structure 46 of the electronic device 6*a* of the molded structure 5*a* by metal-to-metal bonding. The singulation lines 79 of the sixth wafer 7' may be aligned with the singulation lines 59 of the molded structure 5*a* to collectively form the singulation lines 59*a*.

Figure 21:
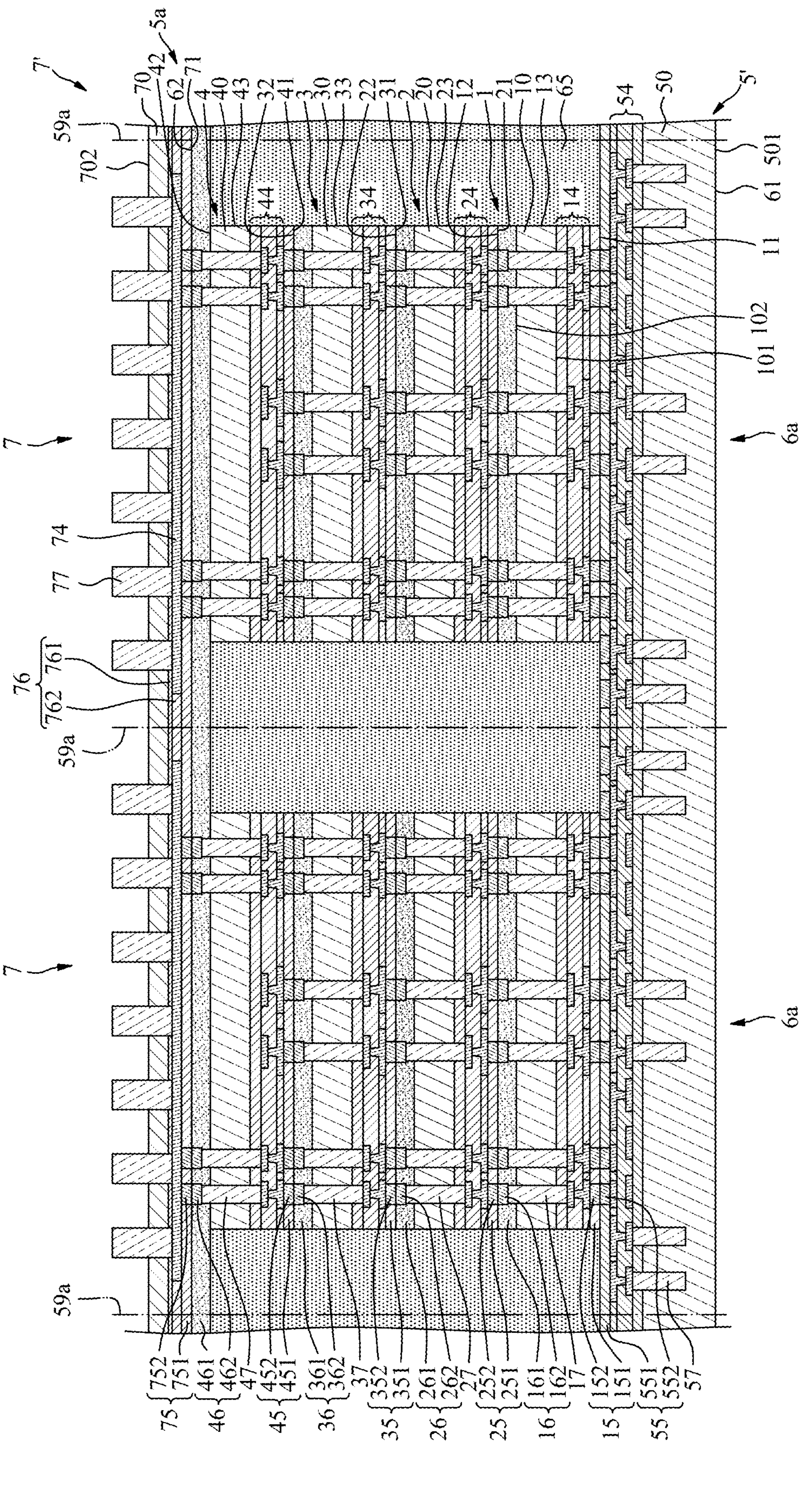

With reference to FIG. 21, the sixth base portion 70 (e.g., the base portion 70) may be thinned from its second surface 702 (e.g., the top surface) by grinding, chemical-mechanical Polishing (CMP) and etching, so as to expose the thermal vias 77. Thus, the thermal vias 77 may extend beyond the second surface 702 (e.g., the top surface) of the sixth base portion 70 (e.g., the base portion 70). The thermal vias 77 may extend through the sixth base portion 70 (e.g., the base portion 70). In some embodiments, the barrier layer 774 may be not removed, and may remain on the conductive material 773. That is, the protrusion portion of the thermal via 77 protruding from the second surface 702 of the sixth base portion 70 may include the barrier layer 774.

Figure 22:
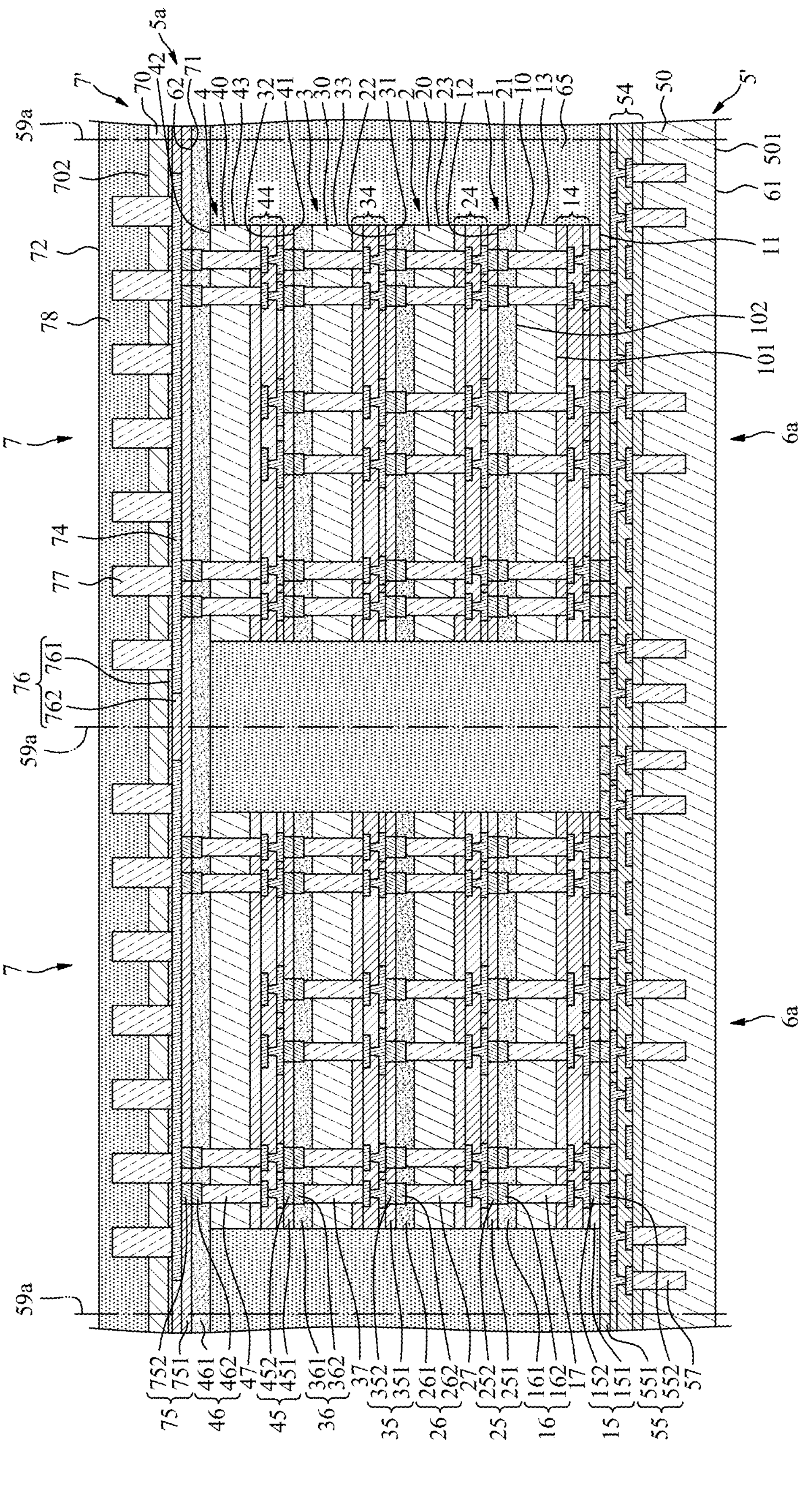

With reference to FIG. 22, a protection material 78 may be formed or disposed on the second surface 702 (e.g., the top surface) of the sixth base portion 70 (e.g., the base portion 70), and may encapsulate the thermal vias 77. The protection material 78 may include a molding compound with or without fillers. The protection material 78 may cover and contact the barrier layer 774 of the thermal via 77.

Figure 23:
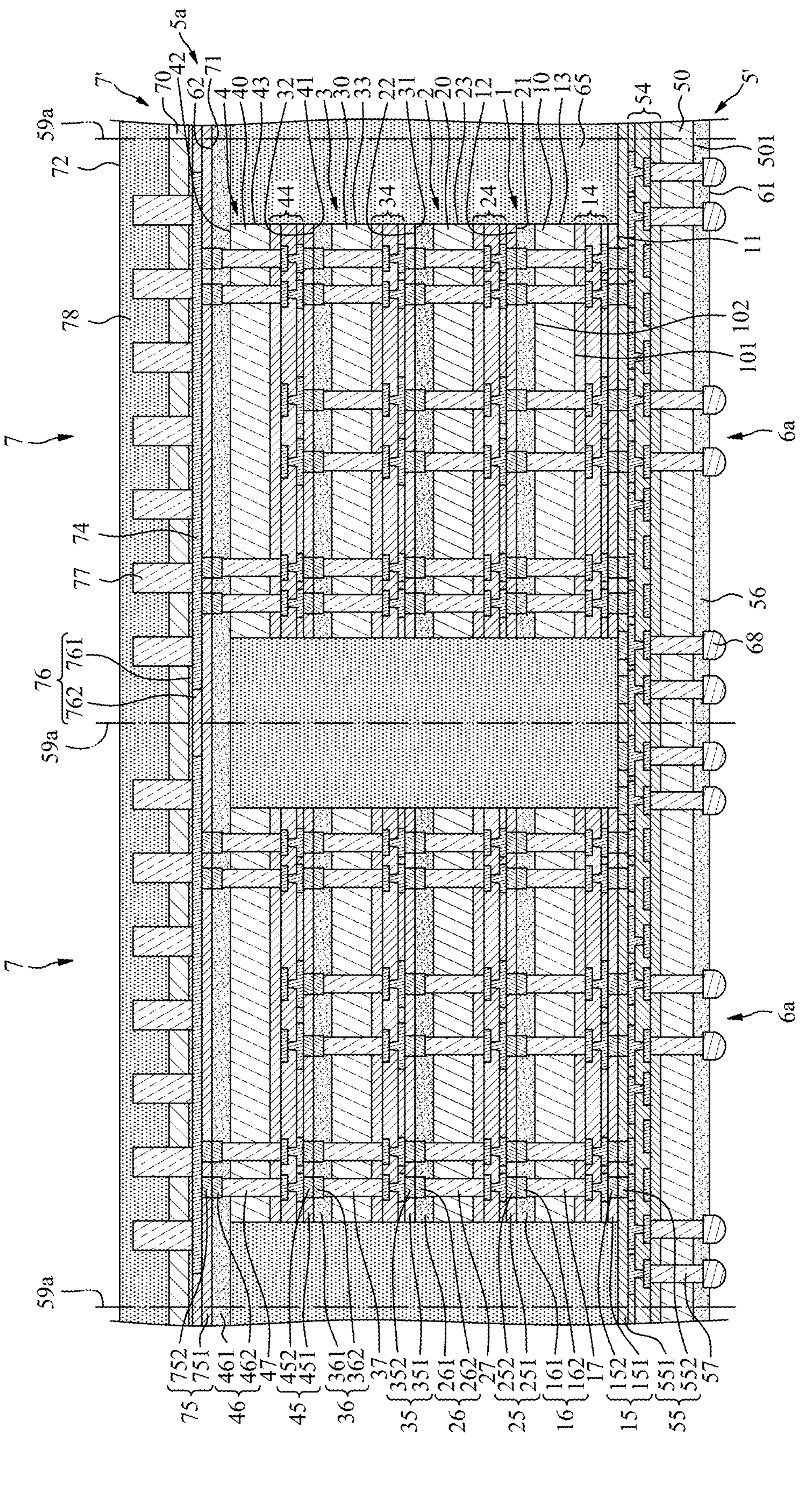

With reference to FIG. 23, the fifth base portion 50 may be thinned from its first surface 501 (e.g., the bottom surface) by grinding, chemical-mechanical Polishing (CMP) and etching, so as to expose the fifth conductive vias 57. Thus, the fifth conductive vias 57 may extend beyond the first surface 501 (e.g., the bottom surface) of the fifth base portion 50. The fifth conductive vias 57 may extend through the fifth base portion 50. A length of the fifth conductive via 57 may be greater than a thickness of the fifth base portion 50.

Then, a dielectric layer 56 may be formed or disposed on the first surface 501 (e.g., the bottom surface) of the fifth base portion 50, and may encapsulate the fifth conductive vias 57. Then, a plurality of external connectors 68 may be formed in the dielectric layer 56 to connect the fifth conductive vias 57 for external connection.

Figure 24:
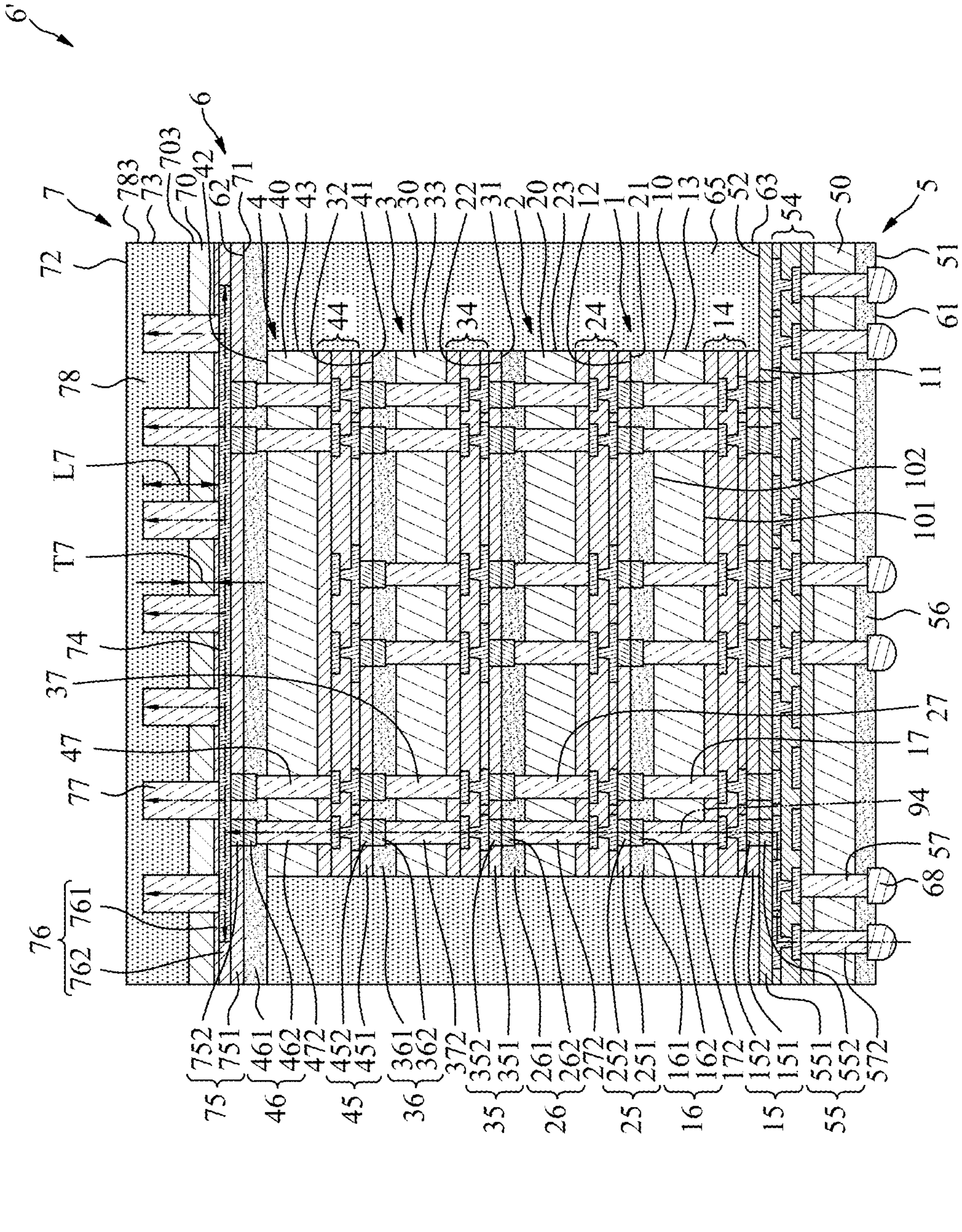

With reference to FIG. 24, a singulation process may be conducted along the singulation lines 59*a* to form a plurality of package structures 6'.

With reference to FIG. 24, a schematic cross-sectional view of a package structure 6' in accordance with some embodiments of the present disclosure is illustrated. The package structure 6' may include an electronic device 6 and a heat sink structure 7. The electronic device 6 may be a stacked structure that includes a plurality stacked memory devices (e.g., dynamic random access memories (DRAMs)). For example, the electronic device 6 may be a high bandwidth memory (HBM).

In some embodiments, the electronic device 6 may include a first semiconductor chip 1, a second semiconductor chip 2, a third semiconductor chip 3, a fourth semiconductor chip 4, a base semiconductor chip 5, an encapsulant 65, a fourth upper structure 46 and a plurality of external connectors 68.

The first semiconductor chip 1 may have a bottom surface 11 (e.g., a first surface), a top surface 12 (e.g., a second surface) and a lateral surface 13 extending between the bottom surface 11 and the top surface 12. The first semiconductor chip 1 may include a first base portion 10, a first conductive structure 14, a first lower structure 15, a first upper structure 16 and a plurality of first conductive vias 17. The first semiconductor chip 1 may be a memory chip such as a dynamic random access memory (DRAM) chip.

The first conductive structure 14 may be disposed on the first surface 101 (e.g., a bottom surface) of the first base portion 10. The first conductive vias 17 may extend through the first base portion 10, and may be electrically connected to the first conductive structure 14. In some embodiments, a bottom end of the first conductive vias 17 may extend beyond the first surface 101 (e.g., the bottom surface) of the first base portion 10, and may extend into the first conductive structure 14. Thus, the first conductive via 17 may be a monolithic structure, and a length of the first conductive via 17 may be greater than a thickness of the first base portion 10. In some embodiments, the first conductive via 17 may extend beyond the second surface 102 (e.g., the top surface) of the first base portion 10.

The first lower structure 15 may be disposed on the first conductive structure 14. The first lower structure 15 may be a hybrid bonding (HB) structure or a solder bonding structure, and may include a first lower dielectric layer 151 and a plurality of first lower pads 152. The first lower dielectric layer 151 may be a hybrid bonding (HB) dielectric layer. Each of the first lower pads 152 may be a hybrid bonding (HB) pad. The first lower pads 152 may be embedded in the first lower dielectric layer 151, and may be exposed by the first lower dielectric layer 151. The first lower pads 152 may be surrounded by the first lower dielectric layer 151. The first lower pads 152 may be electrically connected to the first conductive vias 17 through the first conductive structure 14.

In some embodiments, a bottom surface of the first lower pad 152 may be substantially aligned with a bottom surface of the first lower dielectric layer 151. Thus, the bottom surface of the first lower pad 152 may be exposed by the bottom surface of the first lower dielectric layer 151. In some embodiments, a top surface of the first lower pad 152 may be substantially aligned with a top surface of the first lower dielectric layer 151. Thus, the top surface of the first lower pad 152 may contact the first conductive structure 14. In some embodiments, a thickness of the first lower pad 152 may be substantially equal to a thickness of the first lower dielectric layer 151.

The first upper structure 16 may be disposed on the second surface 102 (e.g., the top surface) of the first base portion 10. The first upper structure 16 may be a hybrid bonding (HB) structure, and may include a first upper dielectric layer 161 and a plurality of first upper pads 162.

The first upper dielectric layer 161 may be a hybrid bonding (HB) dielectric layer. Each of the first upper pads 162 may be a hybrid bonding (HB) pad. The first upper pads 162 may be embedded in the first upper dielectric layer 161, and may be exposed by the first upper dielectric layer 161. The first upper pads 162 may be surrounded by the first upper dielectric layer 161. The first upper pads 162 may be electrically connected to the first conductive vias 17. In some embodiments, the first upper pads 162 may directly contact the first conductive vias 17. The first upper pads 162 may be electrically connected to the first lower pad 152 through the first conductive vias 17 and the first conductive structure 14.

In some embodiments, a top surface of the first upper pad 162 may be substantially aligned with a top surface of the first upper dielectric layer 161. Thus, the top surface of the first upper pad 162 may be exposed by the top surface of the first upper dielectric layer 161. The bottom surface of the first upper pad 162 may contact the first conductive via 17. In some embodiments, a thickness of the first upper pad 162 may be less than a thickness of the first upper dielectric layer 161.

The second semiconductor chip 2 may be stacked on the first semiconductor chip 1, and may be electrically connected to the first semiconductor chip 1 by hybrid bonding or metal-to-metal bonding. The second semiconductor chip 2 may have a bottom surface 21 (e.g., a first surface), a top surface 22 (e.g., a second surface) and a lateral surface 23 extending between the bottom surface 21 and the top surface 22. The bottom surface 21 (e.g., the first surface) of the second semiconductor chip 2 may directly contact the top surface 12 of the first semiconductor chip 1. The lateral surface 23 of the second semiconductor chip 2 may be substantially aligned with or aligned with the lateral surface 13 of the first semiconductor chip 1.

The second semiconductor chip 2 may include a second base portion 20, a second conductive structure 24, a second lower structure 25, a second upper structure 26 and a plurality of second conductive vias 27. The second semiconductor chip 2 may be a memory chip such as a dynamic random access memory (DRAM) chip.

The second conductive structure 24 may be disposed on the first surface (e.g., a bottom surface) of the second base portion 20. The second conductive vias 27 may extend through the second base portion 20, and may be electrically connected to the second conductive structure 24. In some embodiments, a bottom end of the second conductive vias 27 may extend beyond the first surface (e.g., the bottom surface) of the second base portion 20, and may extend into the second conductive structure 24. Thus, the second conductive via 27 may be a monolithic structure, and a length of the second conductive via 27 may be greater than a thickness of the second base portion 20. In some embodiments, the second conductive via 27 may extend beyond the second surface (e.g., the top surface) of the second base portion 20.

The second lower structure 25 may be disposed on the second conductive structure 24. The second lower structure 25 may be a hybrid bonding (HB) structure, and may include a second lower dielectric layer 251 and a plurality of second lower pads 252. The second lower dielectric layer 251 may be a hybrid bonding (HB) dielectric layer. Each of the second lower pads 252 may be a hybrid bonding (HB) pad. The second lower pads 252 may be embedded in the second lower dielectric layer 251, and may be exposed by the second lower dielectric layer 251. The second lower pads 252 may be surrounded by the second lower dielectric layer 251. The second lower pads 252 may be electrically connected to the second conductive vias 27 through the second conductive structure 24.

In some embodiments, a bottom surface of the second lower pad 252 may be substantially aligned with a bottom surface of the second lower dielectric layer 251. Thus, the bottom surface of the second lower pad 252 may be exposed by the bottom surface of the second lower dielectric layer 251. In some embodiments, a top surface of the second lower pad 252 may be substantially aligned with a top surface of the second lower dielectric layer 251. Thus, the top surface of the second lower pad 252 may contact the second conductive structure 24. In some embodiments, a thickness of the second lower pad 252 may be substantially equal to a thickness of the second lower dielectric layer 251.

The second lower structure 25 of the second semiconductor chip 2 may be bonded to and electrically connected to the first upper structure 16 of the first semiconductor chip 1 through hybrid bonding. Thus, the second lower pad 252 of the second semiconductor chip 2 may directly contact the first upper pad 162 of the first semiconductor chip 1. A width of the second lower pad 252 of the second semiconductor chip 2 may be substantially equal to a width of the first upper pad 162 of the first semiconductor chip 1.

The second upper structure 26 may be disposed on the second surface (e.g., the top surface) of the second base portion 20. The second upper structure 26 may be a hybrid bonding (HB) structure or a solder bonding structure, and may include a second upper dielectric layer 261 and a plurality of second upper pads 262.

The second upper dielectric layer 261 may be a hybrid bonding (HB) dielectric layer. Each of the second upper pads 262 may be a hybrid bonding (HB) pad. The second upper pads 262 may be embedded in the second upper dielectric layer 261, and may be exposed by the second upper dielectric layer 261. The second upper pads 262 may be surrounded by the second upper dielectric layer 261. The second upper pads 262 may be electrically connected to the second conductive vias 27. In some embodiments, the second upper pads 262 may directly contact the second conductive vias 27. The second upper pads 262 may be electrically connected to the second lower pad 252 through the second conductive vias 27 and the second conductive structure 24.

In some embodiments, a top surface of the second upper pad 262 may be substantially aligned with a top surface of the second upper dielectric layer 261. Thus, the top surface of the second upper pad 262 may be exposed by the top surface of the second upper dielectric layer 261. The bottom surface of the second upper pad 262 may contact the second conductive via 27. In some embodiments, a thickness of the second upper pad 262 may be less than a thickness of the second upper dielectric layer 261.

In some embodiments, the bottom surface 21 of the second semiconductor chip 2 may include the bottom surface of the second lower pad 252 and the bottom surface of the second lower dielectric layer 251. The top surface 22 of the second semiconductor chip 2 may include the top surface of the second upper pad 262 and the top surface of the second upper dielectric layer 1612. The lateral surface 23 of the second semiconductor chip 2 may include a lateral surface of the second base portion 20, a lateral surface of the second conductive structure 24, a lateral surface of the second lower structure 25 and a lateral surface of the second upper structure 26.

The third semiconductor chip 3 may be stacked on electrically connected to the second semiconductor chip 2 by hybrid bonding or metal-to-metal bonding. The third semiconductor chip 3 may have a bottom surface 31 (e.g., a first surface), a top surface 32 (e.g., a second surface) and a lateral surface 33 extending between the bottom surface 31 and the top surface 32. The bottom surface 31 (e.g., the first surface) of the third semiconductor chip 3 may contact the top surface 22 of the second semiconductor chip 2.

The third semiconductor chip 3 may include a third base portion 30, a third conductive structure 34, a third lower structure 35, a third upper structure 36 and a plurality of third conductive vias 37. The third semiconductor chip 3 may be a memory chip such as a dynamic random access memory (DRAM) chip.

The third base portion 30 may have a first surface (e.g., a bottom surface) and a second surface (e.g., a top surface) opposite to the first surface. The third conductive structure 34 may be disposed on the first surface (e.g., a bottom surface) of the third base portion 30.

The third conductive vias 37 may extend through the third base portion 30, and may be electrically connected to the third conductive structure 34. In some embodiments, a bottom end of the third conductive vias 37 may extend beyond the first surface (e.g., the bottom surface) of the third base portion 30, and may extend into the third conductive structure 34. In some embodiments, the third conductive via 37 may extend beyond the second surface (e.g., the top surface) of the third base portion 30.

The third lower structure 35 may be disposed on the third conductive structure 34. The third lower structure 35 may be a hybrid bonding (HB) structure or a solder bonding structure, and may include a third lower dielectric layer 351 and a plurality of third lower pads 352. The third lower dielectric layer 351 may be a hybrid bonding (HB) dielectric layer. Each of the third lower pads 352 may be a hybrid bonding (HB) pad. The third lower pads 352 may be embedded in the third lower dielectric layer 351, and may be exposed by the third lower dielectric layer 351. The third lower pads 352 may be electrically connected to the third conductive vias 37 through the third conductive structure 34.

The third lower pads 352 of the third lower structure 35 of the third semiconductor chip 3 may be attached to the second upper pads 262 of the second upper structure 26 of the second semiconductor chip 2 by metal-to-metal bonding.

The third upper structure 36 may be disposed on the second surface (e.g., the top surface) of the third base portion 30. The third upper structure 36 may be a hybrid bonding (HB) structure, and may include a third upper dielectric layer 361 and a plurality of third upper pads 362.

The third upper dielectric layer 361 may be a hybrid bonding (HB) dielectric layer. Each of the third upper pads 362 may be a hybrid bonding (HB) pad. The third upper pads 362 may be embedded in the third upper dielectric layer 361, and may be exposed by the third upper dielectric layer 361. The third upper pads 362 may be electrically connected to the third conductive vias 37. In some embodiments, the third upper pads 362 may be electrically connected to the third lower pad 352 through the third conductive vias 37 and the third conductive structure 34.

The fourth semiconductor chip 4 may be stacked on and electrically connected the third semiconductor chip 3 by hybrid bonding or metal-to-metal bonding. The fourth semiconductor chip 4 may have a bottom surface 41 (e.g., a first surface), a top surface 42 (e.g., a second surface) and a lateral surface 43 extending between the bottom surface 41 and the top surface 42. The bottom surface 41 (e.g., the first surface) of the fourth semiconductor chip 4 may directly contact the top surface 32 of the third semiconductor chip 3.

The fourth semiconductor chip 4 may include a fourth base portion 40, a fourth conductive structure 44, a fourth lower structure 45 and a plurality of third conductive vias 37. The fourth semiconductor chip 4 may be a memory chip such as a dynamic random access memory (DRAM) chip.

The fourth conductive structure 44 may be disposed on the first surface (e.g., a bottom surface) of the fourth base portion 40. The fourth lower structure 45 may be disposed on the fourth conductive structure 44. The fourth lower structure 45 may be a hybrid bonding (HB) structure, and may include a fourth lower dielectric layer 451 and a plurality of fourth lower pads 452. The fourth lower dielectric layer 451 may be a hybrid bonding (HB) dielectric layer. Each of the fourth lower pads 452 may be a hybrid bonding (HB) pad. The fourth lower pads 452 may be embedded in the fourth lower dielectric layer 451, and may be exposed by the fourth lower dielectric layer 451.

The fourth lower structure 45 of the fourth semiconductor chip 4 may be bonded to and electrically connected to the third upper structure 36 of the third semiconductor chip 3 through hybrid bonding. For example, the fourth lower dielectric layer 451 of the fourth semiconductor chip 4 may be bonded to the third upper dielectric layer 361 of the third semiconductor chip 3 through dielectric-to-dielectric bonding.

The fourth lower pad 452 of the fourth semiconductor chip 4 may be attached to, joined to, or electrically connected to the third upper pad 362 of the third semiconductor chip 3 through metal-to-metal bonding.

The base semiconductor chip 5 (or a fifth semiconductor chip 5) may have a bottom surface 51 (e.g., a first surface), a top surface 52 (e.g., a second surface) and a lateral surface 53 extending between the bottom surface 51 and the top surface 52. The base semiconductor chip may include a fifth base portion 50, a fifth conductive structure 54, a fifth upper structure 55, a plurality of fifth conductive vias 57 and a dielectric layer 56. The base semiconductor chip 5 may be a controller chip such as an application processor (AP) chip.

The fifth conductive structure 54 may be disposed on the first surface (e.g., the top surface) of the fifth base portion 50. The fifth conductive vias 57 may extend through the fifth base portion 50, and may be electrically connected to the fifth conductive structure 54. In some embodiments, an end of the fifth conductive via 57 may extend into the fifth conductive structure 54.

The fifth upper structure 55 may be disposed on the fifth conductive structure 54. The fifth upper structure 55 may be a hybrid bonding (HB) structure or a solder bonding structure, and may include a fifth upper dielectric layer 551 and a plurality of fifth upper pads 552. The fifth upper dielectric layer 551 may be a hybrid bonding (HB) dielectric layer.

Each of the fifth upper pads 552 may be a hybrid bonding (HB) pad. The fifth upper pads 552 may be embedded in the fifth upper dielectric layer 551, and may be exposed by the fifth upper dielectric layer 551.

The dielectric layer 56 may be formed or disposed on the first surface (e.g., the bottom surface) of the fifth base portion 50, and may encapsulate the fifth conductive vias 57.

The first lower pads 152 of the first lower structure 15 of the first semiconductor chip 1 may be bonded to and electrically connected to the fifth upper pad 552 of the fifth upper structure 55 of the base semiconductor chip 5 through hybrid bonding.

The encapsulant 65 may be a molding compound with or without fillers. The encapsulant 65 may encapsulate the first semiconductor chip 1, the second semiconductor chip 2, the third semiconductor chip 3, the fourth semiconductor chip 4 and the top surface 52 of the base semiconductor chip 5. The encapsulant 65 may cover the lateral surface 13 of the first semiconductor chip 1, the lateral surface 23 of the second semiconductor chip 2, the lateral surface 33 of the third semiconductor chip 3, the lateral surface 43 of the fourth semiconductor chip 4 and the top surface 52 of the base semiconductor chip 5.

The external connectors 68 may be formed in the dielectric layer 56 to connect the fifth conductive vias 57 for external connection. The external connectors 68 may include a reflowable material such as AgSn. Thus, the external connectors 68 may include solder balls, solder bumps or micro-bumps. The external connectors 68 may be disposed on the fifth conductive vias 57.

The fourth upper structure 46 may be disposed on the second surface (e.g., the top surface) of the fourth base portion 40 and the top surface of the encapsulant 65. The fourth upper structure 46 may include a fourth upper dielectric layer 461 and a plurality of fourth upper pads 462. The fourth upper dielectric layer 461 may be disposed on the second surface (e.g., the top surface) of the fourth base portion and the top surface of the encapsulant 65, and may cover a top portion of the fourth conductive via 47. The fourth upper dielectric layer 461 may be a hybrid bonding (HB) dielectric layer.

The fourth upper pads 462 may be embedded in the fourth upper dielectric layer 461, and may be exposed by the fourth upper dielectric layer 461. The fourth upper pads 462 may be electrically connected to the fourth conductive vias 47. In some embodiments, the fourth upper pads 462 may directly contact the fourth conductive vias 47. Each of the fourth upper pads 462 may be a hybrid bonding (HB) pad.

The heat sink structure 7 may be disposed over the electronic device 1. The heat sink structure 7 may have a bottom surface 71 (e.g., a first surface), a top surface 72 (e.g., a second surface) and a lateral surface 73 extending between the bottom surface 71 and the top surface 72. The heat sink structure 7 may include a base portion 70, a thermally conductive layer 74, a lower structure 75, a dielectric structure 76, a plurality of thermal vias 77 and a protection layer 78. The heat sink structure 7 may be a chip structure.

The base portion 70 may have a first surface (e.g., a bottom surface) and a second surface (e.g., a top surface) opposite to the first surface. The dielectric structure 76 may include a first dielectric layer 761 and a second dielectric layer 762. The first dielectric layer 761 may be disposed on the first surface (e.g., the bottom surface) of the base portion 70. The thermal vias 77 may extend through the first dielectric layer 761 and the base portion 70. A length of the thermal via 77 may be greater than a thickness of the base portion 70.

The thermally conductive layer 74 and the second dielectric layer 762 may be formed on the first dielectric layer 761. The thermally conductive layer 74 may include metal such as copper (Cu) or other suitable material. The thermally conductive layer 74 may cover and contact the thermal vias 77. Thus, the thermal vias 77 may directly contact and connect to a second surface (e.g., a top surface) of the thermally conductive layer 74. The thermally conductive layer 74 may be disposed between the base portion 70 and the electronic device 6. The thermal vias 77 may be thermally connected to the electronic device 6 through the thermally conductive layer 74 so as to dissipate a heat generated from the electronic device 6. A length L7 of the thermal via 77 may be greater than a thickness T7 of the sixth base portion 70 (e.g., the base portion 70).

The second dielectric layer 762 may surround the thermally conductive layer 74. Thus, the dielectric structure 76 may be disposed on the first surface 701 of the base portion 70, and may encapsulate the thermally conductive layer 74. The thermally conductive layer 74 may be spaced apart from the base portion 70 by the first dielectric layer 761 of the dielectric structure 76. Thus, a portion of the dielectric structure 76 is disposed between the thermally conductive layer 74 and the sixth base portion 70.

The lower structure 75 may be disposed on the thermally conductive layer 74 and the dielectric structure 76. The lower structure 75 may include a lower dielectric layer 751 and a plurality of lower pads 752. The lower pads 752 may be disposed on and may connect to a first surface (e.g., a bottom surface) of the thermally conductive layer 74, and may be embedded in the lower dielectric layer 751. Each of the lower pads 752 may be a hybrid bonding (HB) pad. The lower pads 752 may be exposed by the lower dielectric layer 751. The lower dielectric layer 751 may be a hybrid bonding (HB) dielectric layer. The lower pads 752 may be thermally connected to the electronic device 6 so as to dissipate a heat generated from the electronic device 6 to the thermal vias 77 through the thermally conductive layer 74.

In some embodiments, a bottom surface of the lower pad 752 may be substantially aligned with a bottom surface of the lower dielectric layer 751. Thus, the bottom surface of the lower pad 752 may be exposed by the bottom surface of the lower dielectric layer 751. In some embodiments, a thickness of the lower pad 752 may be substantially equal to a thickness of the lower dielectric layer 751. The protection material 78 may be disposed on the second surface (e.g., the top surface) of the base portion 70, and may encapsulate the thermal vias 77. The protection material 78 may include a molding compound with or without fillers. The protection material 78 does not contact the encapsulant 65.

The heat sink structure 7 may be attached to the electronic device 6 by hybrid bonding. Thus, the thermally conductive layer 74 may be thermally connected to the electronic device 6 through the lower pads 752, the fourth upper pads 462 and the fourth conductive vias 47. In addition, the lateral surface 73 of the heat sink structure 7 may be substantially aligned with the lateral surface 63 of the electronic device 6. The lateral surface 783 of the protection material 78, a lateral surface 703 of the base portion 70 and a lateral surface of the encapsulant 65 of the electronic device 6 (i.e., the lateral surface 63 of the electronic device 6) may be substantially aligned with each other. In addition, the thermally conductive layer 74 of the heat sink structure 7 may vertically overlap the encapsulant 65 of the electronic device 6.

In the embodiment illustrated in FIG. 24, a thermal path 94 (or a heat conduction path, or a thermal dissipation path) may be form to include the fifth periphery via(s) 572, the fifth conductive structure 54, the fifth upper pad(s) 552, the first lower pad(s) 152, the first conductive structure 14, the first periphery via(s) 172, the first upper pad(s) 162, the second lower pad(s) 252, the second conductive structure 24, the second periphery via(s) 272, the second upper pad(s) 262, the third lower pad(s) 352, the third conductive structure 34, the third periphery via(s) 372, the third upper pad(s) 362, the fourth lower pad(s) 452, the fourth conductive structure 44, the fourth periphery via(s) 472, the fourth upper pad(s) 462, the lower pad(s) 752, the thermally conductive layer 74 and the thermal vias 77.

Thus, the heat generated by the electronic device 6 may be dissipated or transmitted to the thermal vias 77 through the thermal path 94 readily and quickly. Thus, the reliability and working life of the package structure 6' may be improved.

Figure 25:
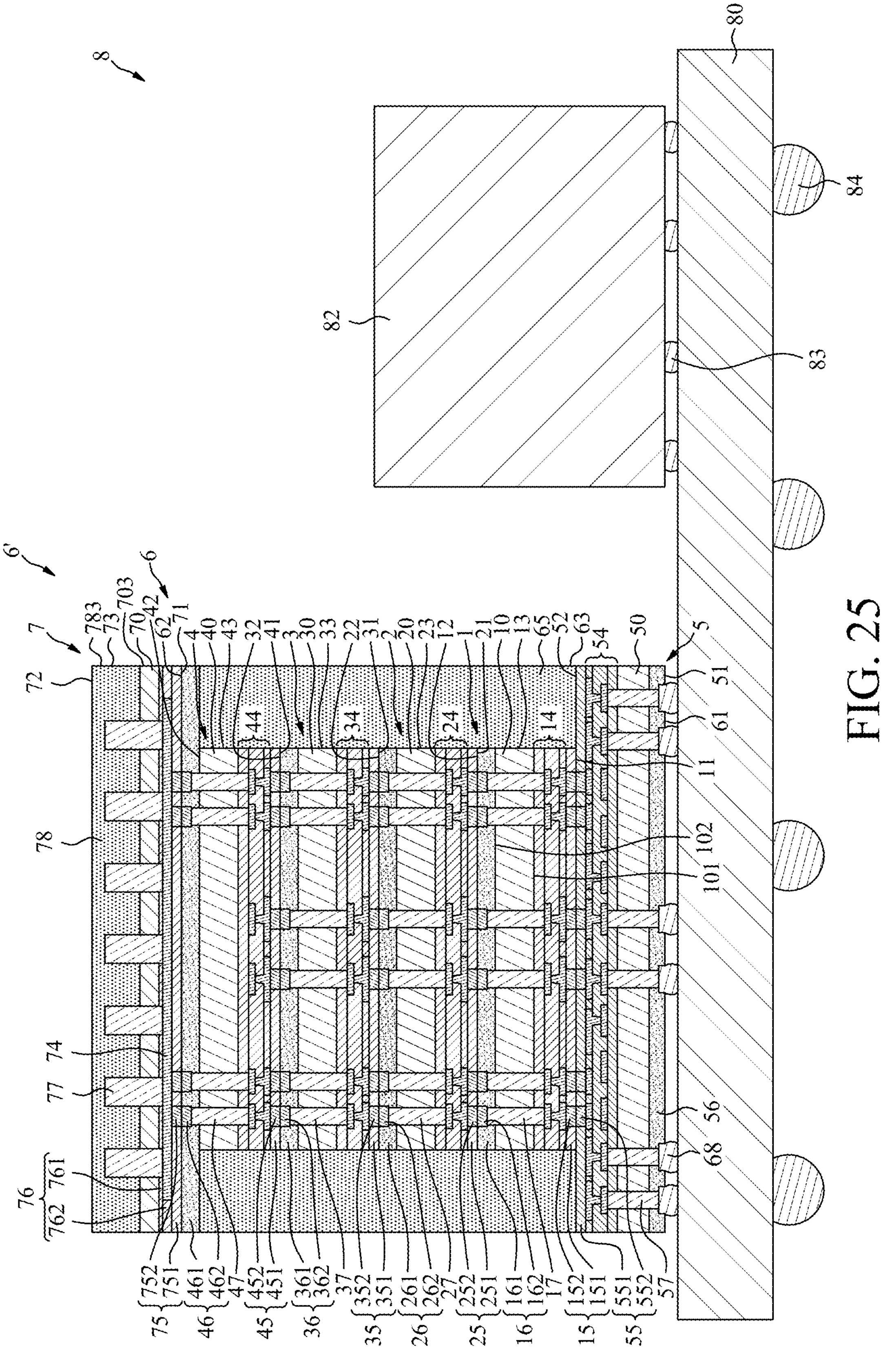
FIG. 25 illustrates, in a schematic cross-sectional view diagram, an assembly structure in accordance with one embodiment of the present disclosure.

With reference to FIG. 25, a schematic cross-sectional view of an assembly structure 8 in accordance with some embodiments of the present disclosure is illustrated. The assembly structure 8 may be a semiconductor structure, and may include an interposer 80 (or a substrate 80), a package structure 6', a semiconductor device 82 and a plurality of external connectors 84.

The interposer 80 may include a base portion, a conductive structure and a plurality of conductive through vias. The base portion may be a semiconductor substrate, and may include, for example, silicon (Si), doped silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some embodiments, the substrate 80 may be a printed circuit board (PCB).

The conductive structure may be disposed on the base portion. In some embodiments, the conductive structure may include a redistribution layer (RDL) structure. The conductive through vias may extend through the base portion, and may be electrically connected to the conductive structure.

The external connectors 84 may be disposed on the bottom surface of the interposer 80 for external connection. The external connectors 84 may include a reflowable material such as AgSn. Thus, the external connectors 84 may include solder balls, solder bumps or micro-bumps. The external connectors 84 may be disposed on the conductive through vias.

The package structure 6' of FIG. 25 may be the package structure 6' of FIG. 24. The package structure 6' may be bonded to and electrically connected to the interposer 80 through the external connectors 68.

The semiconductor device 82 may be a logic chip or a logic die. The semiconductor device 82 may be bonded to and electrically connected to the interposer 80 through a plurality of solders 83. Thus, the package structure 6' may be electrically connected to or communicated with the semiconductor device 82 through the interposer 80.

One aspect of the present disclosure provides a package structure including an electronic device and a heat sink structure. The heat sink structure is disposed over the electronic device, and includes a base portion, a plurality of thermal vias and a thermally conductive layer. The thermal vias extends through the base portion. The thermally conductive layer is disposed between the base portion and the electronic device. The thermal vias are thermally connected to the electronic device through the thermally conductive layer so as to dissipate a heat generated from the electronic device.

Another aspect of the present disclosure provides a package structure including an electronic device and a heat sink structure. The heat sink structure is disposed over the electronic device, and includes a thermally conductive layer, a plurality of thermal vias and a plurality of pads. The thermal vias connect to a second surface of the thermally conductive layer. The pads connect to a first surface of the thermally conductive layer. The pads are thermally connected to the electronic device so as to dissipate a heat generated from the electronic device to the thermal vias through the thermally conductive layer.

Another aspect of the present disclosure provides a method for manufacturing a package structure including: providing an electronic device; providing a heat sink structure, wherein the heat sink structure includes a base portion, a plurality of thermal vias disposed in the base portion and a thermally conductive layer connecting the plurality of thermal vias; and thermally connecting the heat sink structure to the electronic device, wherein the thermally conductive layer is disposed between the base portion and the electronic device.

Due to the design of the package structure of the present disclosure, the heat generated by the electronic device may be dissipated or transmitted to the thermal vias through a thermal path readily and quickly. Thus, the reliability and working life of the package structure may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A package structure, comprising:

an electronic device; and a heat sink structure disposed over the electronic device, and comprising:

a base portion;

a plurality of thermal vias extending through the base portion; and a thermally conductive layer disposed between the base portion and the electronic device, wherein the plurality of thermal vias are thermally connected to the electronic device through the thermally conductive layer so as to dissipate a heat generated from the electronic device, wherein the heat sink structure further comprises a dielectric structure disposed on a first surface of the base portion, and encapsulating the thermally conductive layer, wherein the heat sink structure further comprises a plurality of pads connecting to the thermally conductive layer and embedded in the dielectric structure, wherein the thermally conductive layer is thermally connected to the electronic device through the plurality of pads.

2. The package structure of claim 1, wherein the heat sink structure is attached to the electronic device by hybrid bonding.

3. The package structure of claim 1, wherein the thermally conductive layer has a net shape.

4. The package structure of claim 3, wherein the thermally conductive layer includes a plurality of lines crossed with each other to form a plurality of intersection portions.

5. The package structure of claim 4, wherein the plurality of thermal vias are connected to the plurality of intersection portions of the thermally conductive layer.

6. The package structure of claim 1, wherein the thermally conductive layer has a plate shape.

7. The package structure of claim 1, wherein the plurality of thermal vias directly contact the thermally conductive layer.

8. The package structure of claim 1, wherein a portion of the dielectric structure is disposed between the thermally conductive layer and the base portion.

9. The package structure of claim 1, wherein the heat sink structure further comprises a protection material disposed on a second surface of the base portion, and encapsulating the plurality of thermal vias.

10. The package structure of claim 1, wherein a material of the base portion includes silicon.

11. The package structure of claim 1, wherein the electronic device comprises:

a first semiconductor chip; and an encapsulant encapsulating the first semiconductor chip, wherein the thermally conductive layer of the heat sink structure vertically overlaps the encapsulant of the electronic device.

12. The package structure of claim 11, wherein a lateral surface of the base portion of the heat sink structure is substantially aligned with a lateral surface of the encapsulant of the electronic device.

13. The package structure of claim 11, wherein the electronic device further comprises:

a second semiconductor chip stacked on and electrically connected to the first semiconductor chip; wherein the encapsulant further encapsulates the second semiconductor chip.

14. The package structure of claim 13, wherein a bottom surface of the second semiconductor chip contacts a top surface of the first semiconductor chip.

15. The package structure of claim 13, wherein the electronic device further comprises:

a third semiconductor chip stacked on and electrically connected to the second semiconductor chip; wherein the encapsulant further encapsulates the third semiconductor chip.

16. The package structure of claim 15, wherein a bottom surface of the third semiconductor chip contacts a top surface of the second semiconductor chip.

17. The package structure of claim 15, wherein the electronic device further comprises:

a fourth semiconductor chip stacked on and electrically connected to the third semiconductor chip; wherein the encapsulant further encapsulates the fourth semiconductor chip.

18. The package structure of claim 17, wherein a bottom surface of the fourth semiconductor chip contacts a top surface of the third semiconductor chip.

* * * * *